United States Patent
Sugiura et al.

(10) Patent No.: US 11,438,009 B2
(45) Date of Patent: Sep. 6, 2022

(54) ENCODING APPARATUS, DECODING APPARATUS, DATA STRUCTURE OF CODE SEQUENCE, ENCODING METHOD, DECODING METHOD, ENCODING PROGRAM, AND DECODING PROGRAM

(71) Applicant: NIPPON TELEGRAPH AND TELEPHONE CORPORATION, Tokyo (JP)

(72) Inventors: Ryosuke Sugiura, Tokyo (JP); Takehiro Moriya, Tokyo (JP); Yutaka Kamamoto, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/289,688

(22) PCT Filed: Oct. 25, 2019

(86) PCT No.: PCT/JP2019/041820
§ 371 (c)(1),
(2) Date: Apr. 28, 2021

(87) PCT Pub. No.: WO2020/095706
PCT Pub. Date: May 14, 2020

(65) Prior Publication Data
US 2022/0006469 A1 Jan. 6, 2022

(30) Foreign Application Priority Data
Nov. 7, 2018 (JP) .............................. JP2018-209841

(51) Int. Cl.
*H03M 7/30* (2006.01)
*H03M 7/40* (2006.01)

(52) U.S. Cl.
CPC ....... *H03M 7/3062* (2013.01); *H03M 7/4075* (2013.01); *H03M 7/6005* (2013.01); *H03M 7/6011* (2013.01)

(58) Field of Classification Search
CPC ............. H03M 7/3062; H03M 7/4075; H03M 7/6005; H03M 7/6011; G10L 19/0017
(Continued)

(56) References Cited

U.S. PATENT DOCUMENTS 7,126,506 B2 * 10/2006 Malvar .................. H03M 7/46
341/67
7,486,211 B2 * 2/2009 Lin ......................... H03M 7/40
341/67

FOREIGN PATENT DOCUMENTS

EP 3661062 A1 6/2020

OTHER PUBLICATIONS

H. S. Malvar (2006) "Adaptive Run-Length/Golomb-Rice Encoding of Quantized Generalized Gaussian Sources with Unknown Statistics," in Proc. Data Compression Conference (DCC) 06, IEEE Computer Society, pp. 23-32, Mar. 2006.
(Continued)

*Primary Examiner* — Khai M Nguyen

(57) ABSTRACT

Provided is an encoding/decoding technique according to which it is possible to perform encoding with a small average bit count, even for a series of integer values with a distribution that is significantly biased to a small value, including small values that are not zero values. The present invention includes an integer encoding unit that, for an input series of non-negative values $x_n$, $n \in \{1, 2, \ldots, N\}$ (hereinafter referred to as "integer series"), obtains a one-bit code with a bit value of "x" as a code corresponding to L consecutive integer values 0 included in the integer series, L being an integer that is 2 or more, and obtains a $K \times x_n$-bit or a $K \times x_n + 1$-bit code that includes at least one bit value "x"
(Continued)

and at least one bit value "y" in the first bit to the K-th bit and in which the bit values of the K×($x_n$−1) bits from the end are "y", as a code corresponding to a set composed of 0 to L−1 consecutive integer values 0 included in the integer series and one integer value $x_n$ other than 0.

12 Claims, 15 Drawing Sheets

(58) Field of Classification Search
USPC .................................... 341/50–51, 65, 67
See application file for complete search history.

(56) References Cited

OTHER PUBLICATIONS

Seishi Takamura and Yoshiyuki Yashima, (2007) "Efficient Gaussian Source Coding Based on Distribution Mapping," The Journal of the Institute of Image Information and Television Engineers, vol. 61, No. 9, pp. 1357-1362.

Ryosuke Sugiura et al. "Optimal Golomb-Rice Code Extension for Lossless Coding of Low-Entropy Exponentially Distributed Sources" IEEE Transactions on Information Theory, vol. 64, No. 4, pp. 3153-3161, Apr. 2018, IEEE Explore Digital Library, Internet: <URL: https://ieeexplore.ieee.org/Xplore/home.jsp>, <URL: https://ieeexplore.ieee.org/document/8272498>, <URL:https://ieeexplore.ieee.org/stamp/stamp.jsp?tp=&arnumber=8.

Anonymous (2017) "Huflman Coding" Wikipedia, XP055784783, [online] Accessed on Mar. 11, 2021, website https://en.wikipedia.org/w/index.php?title=Huffman_coding&oldid=791354016.

Anonymous (2018) "Golomb Coding" Wikipedia, XP055924787, [online] Accessed on May 24, 2022, website: https://en.wikipedia.org/w/indexphp?title=Golomb_coding&oldid=849527145.

Sugiura et al. (2018) "Optimal Golomb-Rice Code Extension for Lossless Coding of Low-Entropy Exponentially Distributed Sources" IEEE Transactions On Information Theory, vol. 64, No. 4, pp. 3153-3161.

* cited by examiner

| INPUT x | BINARY EXPRESSION | CODE (s= 1) | CODE (s = 2) | CODE (s= 3) |
|---|---|---|---|---|
| 0 | 0000 | 1 | 1 0 | 1 0 |
| 1 | 0001 | 01 | 1 1 | 1 10 |
| 2 | 0010 | 001 | 01 0 | 1 11 |
| 3 | 0011 | 0001 | 01 1 | 01 0 |
| 4 | 0100 | 00001 | 001 0 | 01 10 |
| 5 | 0101 | 000001 | 001 1 | 01 11 |
| 6 | 0110 | 0000001 | 0001 0 | 001 0 |
| 7 | 0111 | 00000001 | 0001 1 | 001 10 |
| 8 | 1000 | 000000001 | 00001 0 | 001 11 |
| 9 | 1001 | 0000000001 | 00001 1 | 0001 0 |
| : | : | : | : | : |

| PARTIAL SERIES OF INTEGER VALUES | CODE |
|---|---|
|  |  |
| 1 | 01 |
| 2 | 01 00 |
| 3 | 01 00 00 |
| 4 | 01 00 00 00 |
| : | : |

(B)

| PARTIAL SERIES OF INTEGER VALUES | CODE |
|---|---|
| 00 | 1 |
| 01 | 1 00 |
| 02 | 1 00 00 |
| 03 | 1 00 00 00 |
| 04 | 1 00 00 00 00 |
| : | : |

| PARTIAL SERIES OF INTEGER VALUES | CODE |
|---|---|
|  |  |
| 1 | 001 |
| 2 | 001 000 |
| 3 | 001 000 000 |
| 4 | 001 000 000 000 |
| : | : |

(B)

| PARTIAL SERIES OF INTEGER VALUES | CODE |
|---|---|
|  |  |
| 01 | 010 |
| 02 | 010 000 |
| 03 | 010 000 000 |
| 04 | 010 000 000 000 |
| : | : |

(C)

| PARTIAL SERIES OF INTEGER VALUES | CODE |
|---|---|
|  |  |
| 001 | 011 |
| 002 | 011 000 |
| 003 | 011 000 000 |
| 004 | 011 000 000 000 |
| : | : |

(D)

| PARTIAL SERIES OF INTEGER VALUES | CODE |
|---|---|
| 0000 | 1 |
| 0001 | 1 000 |
| 0002 | 1 000 000 |
| 0003 | 1 000 000 000 |
| 0004 | 1 000 000 000 000 |
| : | : |

| PARTIAL SERIES OF INTEGER VALUES | CODE |
|---|---|
|  |  |
| 1 | 010 |
| 2 | 010 00 |
| 3 | 010 00 00 |
| 4 | 010 00 00 00 |
| : | : |

(B)

| PARTIAL SERIES OF INTEGER VALUES | CODE |
|---|---|
|  |  |
| 01 | 011 |
| 02 | 011 00 |
| 03 | 011 00 00 |
| 04 | 011 00 00 00 |
| : | : |

(C)

| PARTIAL SERIES OF INTEGER VALUES | CODE |
|---|---|
| 000 | 1 |
| 001 | 1 00 |
| 002 | 1 00 00 |
| 003 | 1 00 00 00 |
| 004 | 1 00 00 00 00 |
| : | : |

| PARTIAL SERIES OF INTEGER VALUES | CODE |
|---|---|
|  |  |
| 1 | 001 |
| 2 | 001 000 |
| 3 | 001 000 000 |
| 4 | 001 000 000 000 |
| : | : |

(B)

| PARTIAL SERIES OF INTEGER VALUES | CODE |
|---|---|
|  |  |
| 01 | 010 |
| 02 | 010 000 |
| 03 | 010 000 000 |
| 04 | 010 000 000 000 |
| : | : |

(C)

| PARTIAL SERIES OF INTEGER VALUES | CODE |
|---|---|
|  |  |
| 001 | 0110 |
| 002 | 0110 000 |
| 003 | 0110 000 000 |
| 004 | 0110 000 000 000 |
| : | : |

(D)

| PARTIAL SERIES OF INTEGER VALUES | CODE |
|---|---|
|  |  |
| 0001 | 0111 |
| 0002 | 0111 000 |
| 0003 | 0111 000 000 |
| 0004 | 0111 000 000 000 |
| : | : |

(E)

| PARTIAL SERIES OF INTEGER VALUES | CODE |
|---|---|
|  |  |
| 00000 | 1 |
| 00001 | 1 000 |
| 00002 | 1 000 000 |
| 00003 | 1 000 000 000 |
| 00004 | 1 000 000 000 000 |
| : | : |

Fig.15

ENCODING APPARATUS, DECODING APPARATUS, DATA STRUCTURE OF CODE SEQUENCE, ENCODING METHOD, DECODING METHOD, ENCODING PROGRAM, AND DECODING PROGRAM

CROSS-REFERENCE TO RELATED APPLICATIONS

This application is a U.S. 371 Application of International Patent Application No. PCT/JP2019/041820, filed on 25 Oct. 2019, which application claims priority to and the benefit of JP Application No. 2018-209841, filed on 7 Nov. 2018, the disclosures of which are hereby incorporated herein by reference in their entireties.

TECHNICAL FIELD

The present invention relates to a technique of encoding and decoding a sample series composed of integer values, such as a sample series of audio or acoustic chronological digital signals.

BACKGROUND ART

Examples of techniques for encoding a sample series for the purpose of compression include a technique of reducing a bit length used for description of a sample series by reversibly encoding finite-precision values (hereinafter referred to as integer values) obtained by quantizing sample values. In this technique, the length of the code that is allocated to the integer value is directly connected to the compression performance. This fact is not the exception, even in an engineering application for encoding or decoding of a sample series, such as image encoding in which a sample series of image signals is encoded and decoded, and acoustic encoding in which a sample series of acoustic signals is encoded and decoded.

In general, in variable-length reversible encoding, there is a restriction on the configuration of a code allocated to an integer value due to a restriction of decodability. Specifically, it is a restriction that if a short code is allocated to a certain integer value, a long code needs to be allocated to another integer value in order to make the code decodable. Accordingly, in order to increase the compression performance, it is necessary that the configuration of the code (allocation of the code to integer values) is suitable for the distribution of values in the series of the integer values. Specifically, due to a short code being allocated to an integer value with a high appearance probability and a long code being allocated to an integer value with a low appearance probability, it is possible to reduce the size of the expected value of the compressed bit length of the series of integer values.

A Golomb code has been used as one of the simplest variable-length codes in the above-described reversible encoding. It is known that the smallest expected bit length (minimum bit length) is achieved if the series of integer values belongs to an exponential distribution, that is, if the appearance probability of the integer values decreases exponentially with respect to the size of the value.

This Golomb code has been widely used due to the fact that it is a very simple configuration. For example, a Golomb code is used when encoding a series of absolute values of integer values obtained by dividing sample values by quantized values, the sample values being included in a series of integer values converted into PCM by performing AD conversion on an acoustic signal, a series obtained by performing a Fourier transform on that series to convert it into a frequency spectrum, or the like. Alternatively, a Golomb code is used when encoding a series composed of non-negative integer values obtained by replacing the sample values x of the above-described integer values into x', which is obtained using the following Expression (1).

[Formula 1]

$$x' = \begin{cases} 2|x| - 1 & (\text{if } x > 0) \\ 2|x| & (\text{otherwise}) \end{cases} \quad (1)$$

Accordingly, although a case will be described below in which the non-negative integer values are encoded and decoded, based on the above-described fact that all of the integer values can be converted one-to-one into non-negative integer values using Expression (1) or the like, it is possible to adapt also to encoding and decoding of all of the integer values by converting all of the integer values into non-negative integer values using Expression (1) in the beginning stage of the encoding processing, or converting the non-negative integer values into all of the integer values through inverse transformation or the like of Expression (1) in the later stage of decoding processing.

In Golomb encoding, according to the value of a Golomb parameter s, as shown in the table of FIG. 1, the code for input x of a non-negative integer value increases by 1 bit each time the value of the input x increases by s, and encoding can be performed such that the approximately optimal expected bit length is applied to a series of non-negative integer values that follow an exponential distribution (one-sided Laplace distribution) of Expression (2) below.

[Formula 2]

$$p\left(x, 2^{-\frac{1}{s}}\right) = \left(1 - 2^{-\frac{1}{s}}\right) \cdot 2^{-\frac{x}{s}} \quad (2)$$

Note that the Golomb parameter s is a natural number. That is, if the Golomb parameter s is a small natural number, a series with a large value bias can be encoded with a low average bit count, and if s is a large natural number, a series with a small value bias can be encoded with a low average bit count. Note that a Golomb code in which s is an exponent of 2 is called a Golomb-Rice code in particular. Specifically, a Golomb-Rice code is a Golomb code that is used when the Golomb parameter $s=2^r$ is used, where r is the Rice parameter, which is a non-negative integer value.

However, in an actual distribution of an input series of non-negative integer values, any actual numerical value that is greater than 0 can be taken as s in Expression (2), whereas in a Golomb code, the Golomb parameter s cannot be less than 1. Also, regarding r, by which $s=2^r$ is obtained, in an actual distribution of an input series of non-negative integer values, r can be any actual value, whereas in the Golomb-Rice code, the Rice parameter r cannot be a negative value. Accordingly, for example, as the bias in the values of the series becomes greater than $p(x,2^{-1})$, such as a series of values that follow the distribution $p(x,2^{-0.1})$, the efficiency of compression decreases no matter how the Golomb parameter s or the Rice parameter r is set.

For example, when an acoustic signal is subjected to AD conversion to obtain a PCM, the range of numerical values that can be expressed is set such that recording is possible up to a large volume, and therefore the values included in many series of signals tend to be biased toward values with small absolute values in the range of numerical values that can be expressed. In particular, since an audio signal has a time segment with no utterance, the values tend to be biased toward zero values or very small values of only background noise. Also, a series of integer values obtained by dividing the values included in this kind of series of signals by quantized values is even more biased toward smaller values that include zero values, relative to the original series, due to quantization.

Examples of prior techniques for encoding a series of integer values biased toward zero values include the technique disclosed in NPL 1. In the technique of NPL 1, the number of consecutive zero values included in an input series of integer values is encoded with a predetermined fixed number of bits, and values other than the zero values included in the input series of integer values are obtained by subjecting a value (value-1) obtained by subtracting 1 from that value to Golomb-Rice encoding.

Also, the technique disclosed in NPL 2 is an example of a prior technique for encoding the series of integer values biased toward small values including zero values. In the technique disclosed in NPL 2, a set of two integer values and one integer value are linked in advance as in a bijection, the set of two integer values included in the series of integer values is converted into one integer value, and the series of converted integer values is subjected to Golomb-Rice encoding.

CITATION LIST

Non-Patent Literature

[NPL 1] H. S. Malvar, "Adaptive Run-Length/Golomb-Rice Encoding of Quantized Generalized Gaussian Sources with Unknown Statistics", in Proc. Data Compression Conference (DCC) 06, IEEE Computer Society, pp. 23-32, March 2006.
[NPL 2] S. Takamura, Y. Yashima, "Efficient Gaussian Source Coding Based on Distribution Mapping", ITE Journal, Vol. 61, no. 9, pp. 1357-1362, 2007.

SUMMARY OF THE INVENTION

Technical Problem

According to the technique disclosed in NPL 1, zero values can be encoded with a small average bit count. However, in the technique disclosed in NPL 1, encoding that is approximately the same as Golomb-Rice encoding is performed on values other than zero values, and therefore there is a problem in the technique disclosed in NPL 1 in that if small values that are not zero values are significantly biased relative to a distribution $p(x,2^{-1})$, the compression performance will decrease.

Also, the technique disclosed in NPL 1 is not an encoding method corresponding to a distribution expressed mathematically. Accordingly, in the technique disclosed in NPL 1, there is also a problem in that although the distribution of values in the series of integer values is known, it is not known which bit count is to be chosen and encoded as the bit count to be used when expressing the number of consecutive zero values to perform encoding with a low average bit count.

On the other hand, according to the technique of NPL 2, the series of integer values that are biased relative to the distribution $p(x,2^{-1})$ can be encoded with a small average bit count. However, in the technique disclosed in NPL 2, there is a problem in that the average bit count with respect to one integer value cannot be made smaller than 0.5 bits, and thus the compression performance decreases for a series of integer values with a significant bias, such as the theoretically optimal average bit count being less than 0.5 bits.

In view of this, the present invention aims to provide an encoding/decoding technique according to which it is possible to perform encoding with a small average bit count, even for a series of integer values with a distribution that is significantly biased to a small value, including small values that are not zero values.

Means for Solving the Problem

One aspect of the present invention includes an integer encoding unit configured to, for an input series of non-negative integer values $x_n$, $n \in \{1, 2, \ldots, N\}$ (hereinafter referred to as an "integer series"), obtain a 1-bit code with a bit value of "x" (hereinafter referred to as "code A") as a code corresponding to L consecutive integer values 0 included in the integer series, and obtain, as a code corresponding to a set composed of 0 to L−1 consecutive integer values 0 and one integer value $x_n$ other than 0 included in the integer series, a K×$x_n$-bit or K×$x_n$+1-bit code (hereinafter referred to as "code B") that includes at least one bit value "x" and at least one bit value "y" in a first bit to a K-th bit, and in which the bit values of the K×($x_n$−1) bits from the end are "y", wherein L numbers of 0 to L−1 consecutive integer values 0 in the integer series are in one-to-one correspondence with L partial codes, namely, (a) one partial code, which is constituted by K+1 bits from a first bit to a (K+1)-th bit of the code B when the code B is K×$x_n$+1 bits, and in which the bit value of the first bit is "x" and the bit values of the second bit to the (K+1)-th bit are "y", (b) p−1 (i.e., $2^K$−L−1) partial codes, which are constituted by K bits from the first bit to the K-th bit of the code B when the code B is K×$x_n$ bits, and in which the bit value of the first bit is "y" and the bit value of at least one bit among the K−1 bits from the second bit to the K-th bit is "x", and (c) 2q (i.e., 2L−$2^K$) partial codes, which are constituted by K+1 bits from the first bit to the (K+1)-th bit of the code B when the code B is K×$x_n$+1 bits, and in which the bit value of the first bit is "y", the bit value of at least one bit among the K−1 bits from the second bit to the K-th bit is "x", the set of K bits from the first bit to the K-th bit is different from the p−1 (i.e., $2^K$−L−1) partial codes of (b) above, and the bit value of the (K+1)-th bit is "x" or "y", where L is an integer that is 2 or more, K is the smallest natural number at which $2^K$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

One aspect of the present invention includes an integer decoding unit configured to obtain a series of integer values $x_n$, $n \in \{1, 2, \ldots, N\}$ by, for an input code string, obtaining L consecutive integer values 0 based on a 1-bit code (hereinafter referred to as "code A") with a bit value of "x" included in the input code string, and obtaining a set of 0 to L−1 consecutive integer values 0 and one integer value $x_n$ other than 0 based on a K×$x_n$-bit or K×$x_n$+1-bit code (hereinafter referred to as "code B"), which is included in the input code string and includes at least one bit value "x"

and at least one bit value "y" in a first bit to a K-th bit, and in which the bit values of the K×($x_n$−1) bits from the end are "y", wherein L partial codes, namely, (a) one partial code, which is constituted by K+1 bits from a first bit to a (K+1)-th bit of the code B when the code B is K×$x_n$+1 bits, and in which the bit value of the first bit is "x" and the bit values of the second bit to the (K+1)-th bit are "y", (b) p−1 (i.e., 2K−L−1) partial codes, which are constituted by K bits from the first bit to the K-th bit of the code B when the code B is K×$x_n$ bits, and in which the bit value of the first bit is "y" and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is K×$x_n$+1 bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", are in one-to-one correspondence with the L numbers of 0 to L−1 consecutive integer values 0 in the series of integer values obtained by the integer decoding unit, where L is an integer that is 2 or more, K is the smallest natural number at which $2^1$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

One aspect of the present invention is a data structure of a code string indicating a series of integer values $x_a$, n∈{1, 2, . . . , N} (hereinafter referred to as an "integer series"), which are non-negative values, wherein the code string is to be used by an encoding apparatus configured to obtain the code string from the integer series, and/or a decoding apparatus configured to obtain the integer series from the code string, the data structure includes a 1-bit code (hereinafter referred to as "code A") with a bit value of "x" as a code corresponding to L consecutive integer values 0 included in the integer series, and a K×$x_n$-bit or K×$x_n$+1-bit code (hereinafter referred to as "code B"), which includes at least one bit value "x" and at least one bit value "y" in a first bit to a K-th bit and in which the bit values of the K×($x_n$−1) bits from the end are "y", as a code corresponding to a set of 0 to L−1 consecutive integer values 0 and one integer value $x_n$ other than 0, included in the integer series, and the L numbers of 0 to L−1 consecutive integer values 0 in the integer series are in one-to-one correspondence with L partial codes, namely, (a) one partial code, which is constituted by K+1 bits from a first bit to a (K+1)-th bit of the code B when the code B is K×$x_n$+1 bits, and in which the bit value of the first bit is "x" and the bit values of the second bit to the (K+1)-th bit are "y", (b) p−1 (i.e., $2^K-L-1$) partial codes, which are constituted by K bits from the first bit to the K-th bit of the code B when the code B is K×$x_n$ bits, and in which the bit value of the first bit is "y" and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is K×$x_n$+1 bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", where L is an integer that is 2 or more, K is the smallest natural number at which $2^K$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

Effects of the Invention

According to the present invention, encoding can be performed with a low average bit count also for a series of integer values that is significantly biased toward small values including small values that are not zero values, or a series of integer values that is biased such that it cannot be completely handled using the technique of NPL 2. Also, this kind of code can be decoded.

BRIEF DESCRIPTION OF DRAWINGS

FIG. 1 is a diagram showing a Golomb code for an input x that is a non-negative integer value.

FIG. 9 is a diagram showing an example of correspondence tables used when K=2.

FIG. 10 is a diagram showing an example of correspondence tables used when K=3.

FIG. 14 is a diagram showing an example of correspondence tables used when L=3.

FIG. 15 is a diagram showing an example of correspondence tables used when L=5.

DESCRIPTION OF EMBODIMENTS

Hereinafter, embodiments of the present invention will be described in detail. Note that constituent portions having the same functions are denoted by the same numbers and redundant description thereof is omitted.

First Embodiment

<<Encoding Apparatus>>

Figure 2:
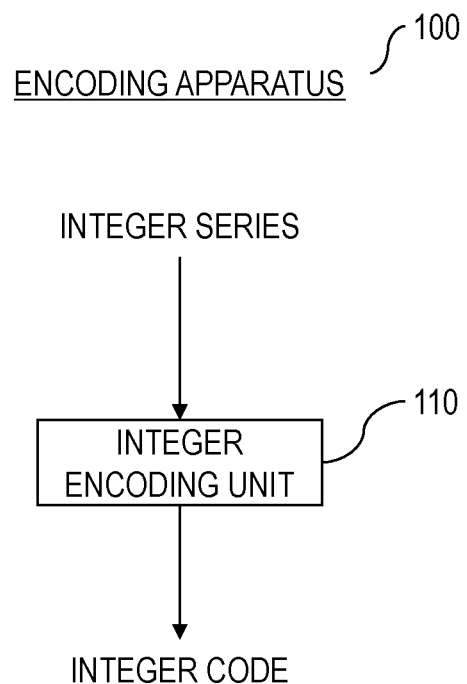
FIG. 2 is a block diagram showing an example of a configuration of an encoding apparatus 100.
Figure 3:
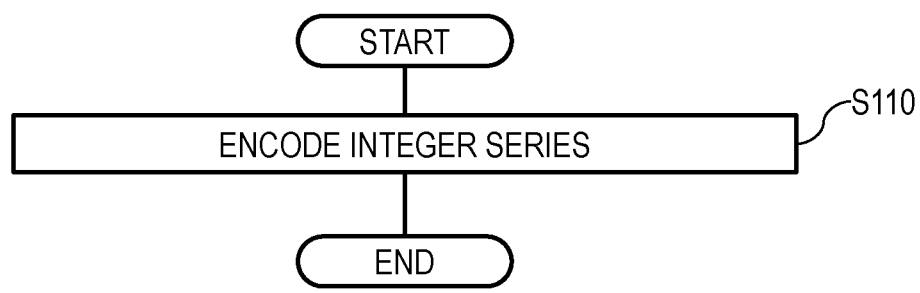
FIG. 3 is a flowchart showing an example of an operation of the encoding apparatus 100.

A processing procedure of an encoding method executed by an encoding apparatus 100 of a first embodiment will be described with reference to FIGS. 2 and 3. As shown in FIG. 2, the encoding apparatus 100 of the first embodiment includes an integer encoding unit 110. The encoding method of the first embodiment is realized due to the encoding apparatus 100 of the first embodiment executing the processing of the steps shown in FIG. 3.

A series of non-negative integer values are input to the encoding apparatus 100 of the first embodiment. For example, as this series of non-negative integer values, a series of absolute values of integer values obtained by converting some or all signals such as a signal obtained by converting audio, music, or the like collected by a microphone into a digital signal, or a signal obtained by converting an image or video captured by a camera into a digital signal, into finite-precision values through quantization using a known technique, or a series of x' obtained through Expression (1) using x as the integer values, may also be input.

The encoding apparatus 100 of the first embodiment uses multiple pre-determined code trees in accordance with a pre-determined rule, and performs variable-length encoding of a series of non-negative integer values, thereby realizing encoding processing in which a shorter bit length than in Golomb encoding and Golomb-Rice encoding is achieved for a series of non-negative integer values of a distribution with a more significant bias than an exponential distribution envisioned by Golomb encoding and Golomb-Rice encoding. Here, a code tree refers to a graph indicating a predetermined rule regarding which code to allocate to an input non-negative integer value. Hereinafter, non-negative integer values input to the encoding apparatus 100 will simply be called "integer values" in the description.

[Integer Encoding Unit 110]

A series of integer values of N samples (N being a natural number) in a series of integer values input to the encoding apparatus 100 is input to the integer encoding unit 110. The input series of integer values is the integer series $x_1, x_2, \ldots,$ and $x_N$. Based on an encoding parameter K, which is a natural number greater than or equal to 2 that is stored in advance in the integer encoding unit 110 or input through means not shown in the drawings, the integer encoding unit 110 encodes the integer series $x_1, x_2, \ldots,$ and $x_N$ through encoding processing using the code trees below to obtain a code, and the obtained code is output as an integer code (S110). Hereinafter, description will be given assuming that each integer of the integer series $x_1, x_2, \ldots,$ and $x_N$ is $x_n$ (n being a sample number in a series; $n \in \{1, 2, \ldots, N\}$).

[[Code Trees Used in Encoding Processing]]

First, an example of the codes tree used in the encoding processing of the integer encoding unit 110 will be described.

Figure 4:
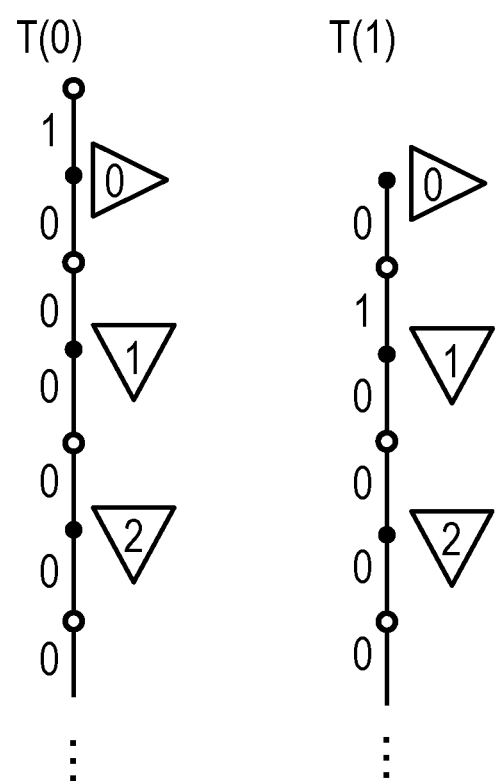
FIG. 4 is a diagram showing an example of code trees used when K=2.
Figure 5:
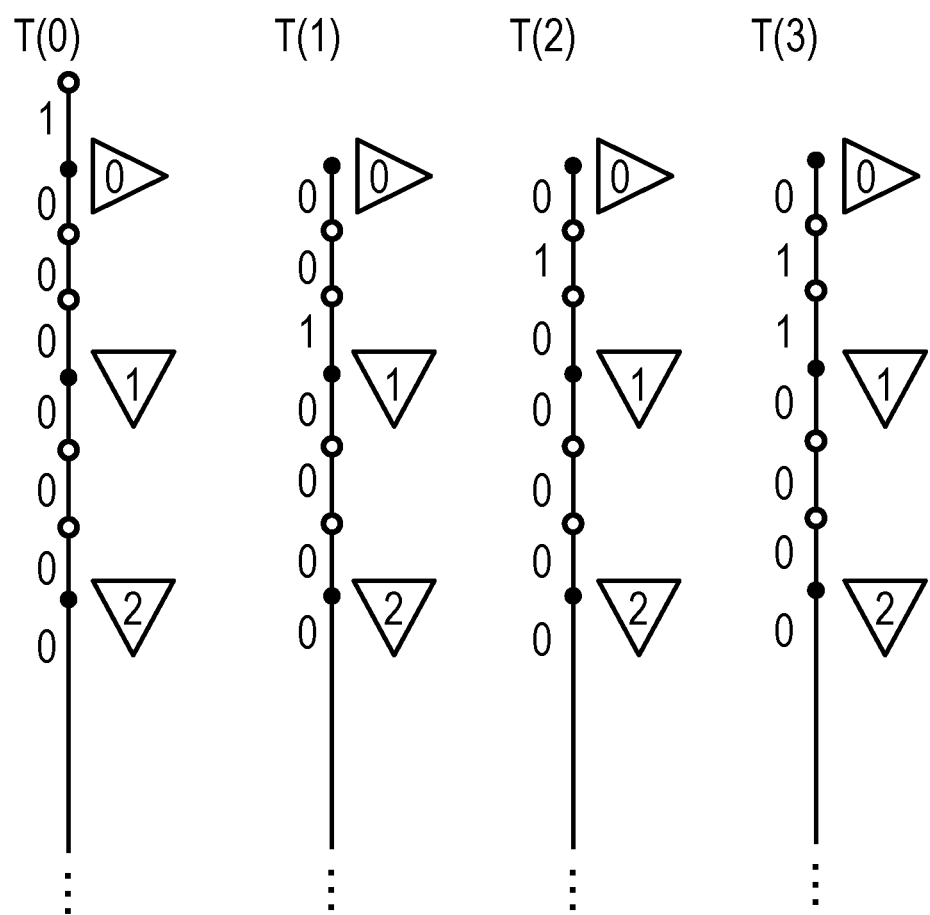
FIG. 5 is a diagram showing an example of code trees used when K=3.
Figure 6:
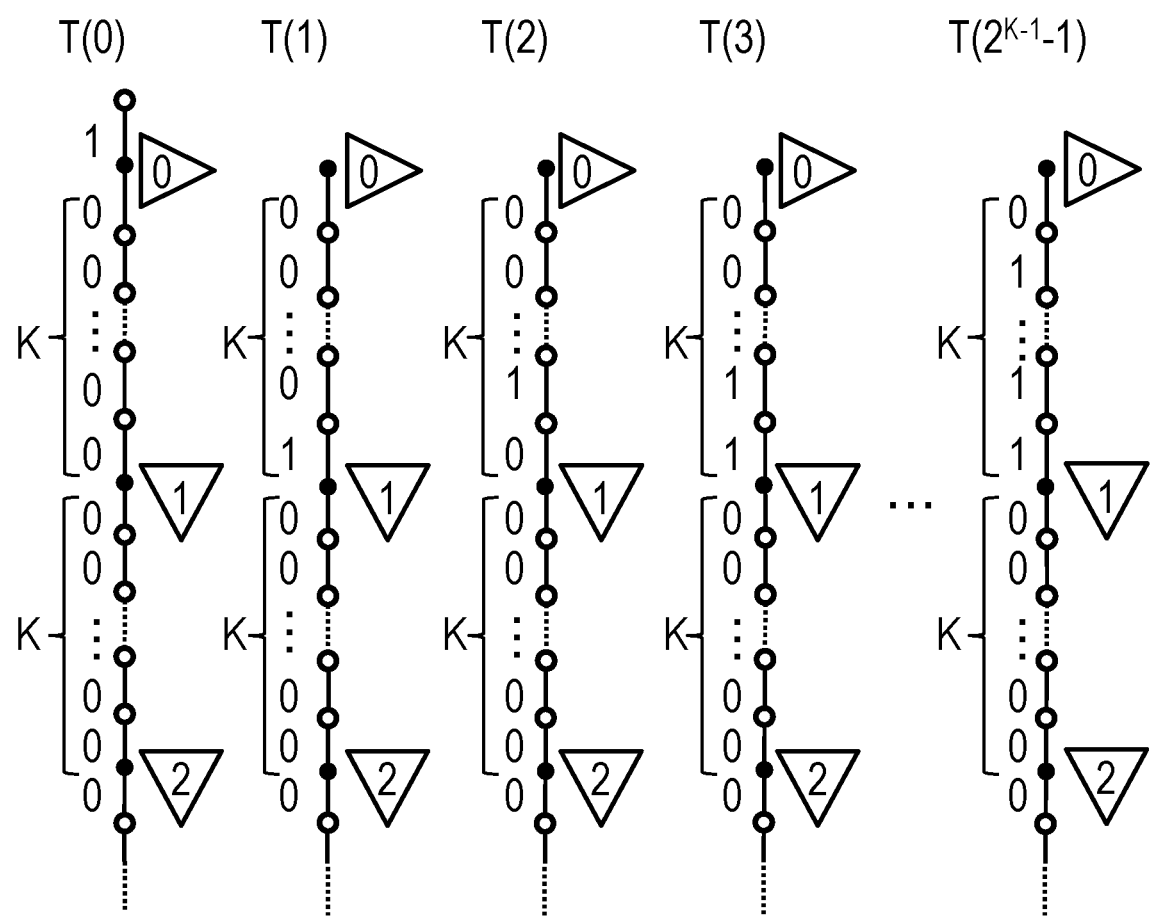
FIG. 6 is a diagram showing an example of code trees used when K is generalized.

$2^{K-1}$ (2 to the power of K−1) code trees illustrated in FIGS. 4 to 6 are stored in advance in the integer encoding unit 110. FIG. 4 is an example of code trees used when K=2, T(0) and T(1) being code trees. FIG. 5 is an example of code trees used when K=3, T(0) to T(3) being code trees. FIG. 6 is an example of code trees used when K is generalized, T(0) to T($2^{K-1}$−1) being code trees. Hereinafter, the numbers in the parentheses added to T will be called code tree numbers.

[[Relationship Between Input Integer Value and Code Corresponding to Integer Value in Code Trees]]

Next, a relationship between an input integer value and a code corresponding to that integer value in each code tree will be described.

The integer values surrounded by triangles on the right side of the nodes of each code tree correspond to input integer values. Also, the bit values "0" and "1" on the left side of the edge of each code tree correspond to the rule of the codes to be allocated to the input integer values. This rule is a rule in which bit values aligned on the left side of the edge up to the nodes corresponding to the integer values input from the nodes on the upper ends of the code trees are obtained as codes to be allocated to the input integer values.

One of the code trees among the $2^{K-1}$ code trees corresponds to T(0) in FIGS. 4 to 6, and is a code tree corresponding to a rule for obtaining, as a code that corresponds to the input integer value $x_n$, a code in which the bit count is $K \times x_n + 1$ bits, the bit value of the first bit is "1", and the bit values of the second bit to the ($K \times x_n + 1$)-th bit are "0". Note that according to this code tree, if the input integer value $x_n$ is 0, the bit count $K \times x_n + 1$ of the code is one bit, and therefore a 1-bit code for which the bit value is "1" is obtained.

The other $2^{K-1} - 1$ code trees of the $2^{K-1}$ code trees correspond to T(1) to T($2^{K-1}-1$) in FIGS. 4 to 6, and as the code corresponding to the input integer values $x_n$, the bit count is $K \times x_n$ bits, the bit value of the first bit is "0", the bit value of at least one of the K−1 bits from the second bit to the K-th bit is "1", and the bit values of the $K \times (x_n - 1)$ bits from the (K+1)-th bit to the ($K \times x_n$)-th bit are "0". That is, the code tree corresponds to a rule for obtaining a code in which the bit values of the $K \times (x_n - 1)$ bits from the end are "0". In view of this, the K−1 bits from the second bit to the K-th bit are a group of bits that are in one-to-one correspondence with the $2^{K-1} - 1$ code trees. Note that according to these code trees, if the input integer value $x_n$ is 0, the bit count $K \times x_n$ of the code is 0 bits, and therefore no code is obtained.

For example, the rule of the input integer value and the code corresponding to the integer value in the case where K=2 in FIG. 4 is a rule in which "1" is obtained as the code corresponding to the input integer value 0 if the input integer value 0 is encoded using the code tree T(0), "100" is obtained as the code corresponding to the input integer value 1 if the input integer value 1 is encoded using the code tree T(0), "10000" is obtained as the code corresponding to the input integer value 2 if the input integer value 2 is encoded using the code tree T(0), no code corresponding to the input integer value 0 is obtained if the input integer value 0 is encoded using the code tree T(1), "01" is obtained as the code corresponding to the input integer value 1 if the input integer value 1 is encoded using the code tree T(1), and "0100" is obtained as the code corresponding to the input integer value 2 if the input integer value 2 is encoded using the code tree T(1).

[[Rule in which Multiple Code Trees are Used]]

Next, a rule in which multiple code trees are used will be described. Rules in which multiple code trees are used are also stored in advance in the integer encoding unit 110. Hereinafter, a rule in which multiple code trees are used will also be referred to as a code tree transition rule.

The directions of the triangles surrounding the integer values on the right side of the nodes of each code tree shown in FIGS. 4 to 6 correspond to rules in which multiple code trees are used.

The rightward triangle indicates the rule in which the code tree adjacent to the right (the code tree whose code tree number is one bigger) is used when the next integer value of the input integer values is to be encoded. Note that at this time, the right side of the rightmost code tree (code tree with the greatest code tree number) is assumed to be the leftmost code tree (code tree with the smallest code tree number). Note that this rule is merely an example, and any rule may be used as long as it is a rule in which the $2^{K-1}$ code trees are used cyclically. That is, any kind of rule may be used as long as it is a rule in which a different code tree is used for the encoding of the next integer value when a rightward triangle is used in each code tree, and as long as it is a rule in which the code tree to be used for the encoding of the next integer value when a rightward triangle is used is not redundant.

A downward triangle indicates a rule in which the code tree T(1) is used when the next integer value of the input integer values is to be encoded. Note that this rule is also merely an example, and it is also possible to use a rule in which the code tree to be used for the encoding of the next integer value when a rightward triangle is used in the code tree corresponding to T(0) in FIGS. 4 to 6 is the code tree to be used for the encoding of the next integer value when a downward triangle is used.

For example, the rule of the encoding in which the code tree for the case where K=2 in FIG. 4 is used is a rule in which, if the input integer value 0 is to be encoded with the code tree T(1), the code corresponding to the input integer value 0 is not obtained and the code tree to be used when encoding the next integer value is T(0), and if the input integer value 2 is to be encoded with the code tree T(0), "10000" is obtained as the code corresponding to the input integer value 2 and the code tree to be used when encoding the next integer value is T(1).

Although any code tree among the multiple code trees may also be used in the first encoding processing, the rule regarding which code tree is to be used first in the encoding processing is also determined in advance and stored as a rule in which multiple code trees are used. For example, in the case where K=2 in FIG. 4, if the integer series $x_1, x_2, \ldots$, and $x_N$ is to be encoded in order starting from the integer value $x_1$, it is also possible to use a rule in which the integer value $x_1$ is encoded using T(0), and it is also possible to use a rule in which the integer value $x_1$ is encoded using T(1). However, whether T(0) or T(1) is to be used in the encoding of the integer value $x_1$ is determined and stored in advance.

[[Encoding Processing Using Code Trees]]

The integer encoding unit 110 uses the above-described multiple code trees to encode the integer values included in the input integer series $x_1, x_2, \ldots$, and $x_N$ in a predetermined order in accordance with the above-described rule in which multiple code trees are used, and a code is obtained, whereafter the obtained code is output as an integer code. For example, if the predetermined order is the order of sample numbers in the series and the code tree to be used first is T(0), the encoding procedure performed by the integer encoding unit 110 is as follows.

(Encoding Procedure)

1. Set the initial values of the sample number n and the code tree number to 1 and 0 respectively.
2. Repeat (i) to (iv) below until n=N is satisfied.
(i) If the code tree number is 0, obtain the code "1".
(ii) If the integer value $x_n$=0 is satisfied, add 1 to the code tree number and set the result as the new code tree number. At this time, if the code tree number is $2^{K-1}$ after adding 1, set 0 as the new code tree number.
(iii) If the integer value $x_n \neq 0$ is satisfied, obtain a K-bit code composed of "0", which is 1 bit, and K−1 bits that are in one-to-one correspondence with the code tree, further obtain a K×($x_n$−1)-bit code "0", and set 1 as the new code tree number.
(iv) Add 1 to n and set the result as the new n.
3. Remove the code "1" that was obtained first among the codes obtained through steps 1 and 2.
(Alternatively, do not perform the first instance of operation 2.(i))
4. Add the code "1" (terminating code) to the end of the codes obtained through steps 1 to 3.
5. Output the codes obtained through steps 1 to 4 as the integer code.

Note that it is not essential to perform step 3 of the encoding procedure. In the case where the code tree that is used first is T(0), no matter what value the value of $x_1$ is, the code that is obtained first among the codes obtained through steps 1 and 2 is "1". Accordingly, even if a code from which the code "1" that was obtained first has been removed is output by the encoding apparatus 100 as the integer code, the decoding apparatus 150 can perform decoding processing corresponding to the encoding processing performed by the integer encoding unit 110 of the encoding apparatus 100 as long as the decoding apparatus 150 adds the code "1" to the beginning of the input integer code. Due to this, in step 3 of the encoding procedure, the code "1" obtained first is removed. However, step 3 of the encoding procedure does not necessarily need to be performed, and the code "1" that was obtained first among the codes obtained through steps 1 and 2 need not be removed. In this case, it is sufficient that the corresponding decoding apparatus 150 is prevented from performing the processing of adding the code "1" to the beginning of the input integer code, and step 3 of the encoding procedure need not be performed.

Also, depending on how the integer code is transmitted from the encoding apparatus 100 to the decoding apparatus 150, step 4 of the encoding procedure also need not be performed. Although the decoding procedure of the decoding apparatus 150 will be described later, the decoding apparatus 150 needs to be able to specify the end of the integer code in order for the decoding apparatus 150 to perform the decoding processing corresponding to the encoding processing performed by the integer encoding unit 110. For example, a configuration in which the integer code obtained for the integer series $x_1, x_2, \ldots$, and $x_N$ is stored in a packet and transmitted to the decoding apparatus 150 using a known packetization method in the encoding apparatus 100 or in a unit after the encoding apparatus 100 can be employed as the configuration in which the integer code is transmitted from the encoding apparatus 100 to the decoding apparatus 150. In this case, on the decoding side, a configuration in which the integer code is retrieved from the packet in the decoding apparatus 150 or a unit before the decoding apparatus 150 is employed, and therefore the decoding apparatus 150 can specify the end of the integer code. Accordingly, in this kind of case, step 4 of the encoding procedure need not be performed. A configuration in which another code is joined behind the integer code obtained for the integer series $x_1, x_2, \ldots$, and $x_N$ and the result is stored in the above-described packet and transmitted to the decoding apparatus 150, a configuration in which another code is joined behind the integer code obtained for the integer series $x_1, x_2, \ldots$, and $x_N$ without performing the above-described packetization, and the result is transmitted to the decoding apparatus 150, or the like is also employed in some cases as the configuration for transmitting the integer code from the encoding apparatus 100 to the decoding apparatus 150. In these configurations, if step 4 of the encoding procedure is not performed, when the code added behind is "0000", or the like, the decoding apparatus 150 can no longer distinguish where the code corresponding to the N-th integer value ends and where the code joined to the end starts. In view of this, in these configurations, it is necessary to enable the decoding apparatus 150 to keep track of the integer codes corresponding to N integer values and to enable the decoding apparatus 150 to specify the end of the integer code by performing step 4 of the encoding procedure, by storing the same predetermined N values in the encoding apparatus 100 and the decoding apparatus 150, or the like.

Note that the code "0" in the description above is an example of any one bit value among binary bit values, and the code "1" in the description above is an example of the other bit value among binary bit values. That is, obviously, the code "1" may also be used instead of the code "0" in the description above, and the code "0" may also be used instead of the code "1".

[[Example of Encoding Processing]]

Encoding processing performed in the case where the input integer series is $x_1$, $x_2$, $x_3$, $x_4$, and $x_5$ is 0, 0, 2, 0, 0 when the code tree used first when K=2 is satisfied is T(0) will be described as an example of encoding processing. First, since the first integer value $x_1$=0 is encoded with T(0), the code "1" is obtained, 1 is added to the code tree number 0 and the result is set as the new code tree number, and therefore the code tree to be used for the encoding of the next integer value $x_2$=0 is T(1). Since the second integer value $x_2$=0 is encoded with T(1), the code is not obtained, and the result of adding 1 to the code tree number 1 is set as the code tree number. However, the code tree number resulting from adding 1 is $2^{K-1}$, and therefore 0 is set as the new code tree number, and the code tree to be used for the encoding of the next integer value $x_3$=2 is T(0). Since the third integer value x; =2 is encoded with T(0), the code "10000" is obtained, and since a rule is used in which the new code tree number is 1, the code tree to be used for the encoding of the next integer value $x_4$=0 is T(1). Since the fourth integer value $x_4$=0 is encoded with T(1), the code is not obtained, and the result of adding 1 to the code tree number 1 is set as the code tree number. However, the code tree number resulting from adding 1 is $2^{K-1}$, and therefore 0 is set as the new code tree number, and the code tree to be used for the encoding of the next integer value $x_5$=0 is T(0). Since the final integer value $x_5$=0 is encoded with T(0), the code "1" is obtained. The code obtained up to this point is "1100001", but if step 3 of the above-described encoding procedure is performed and step 4 of the above-described encoding procedure is not performed, the code "1" obtained first is omitted, and the final integer code "100001" is obtained.

<<Decoding Apparatus>>

Figure 7:
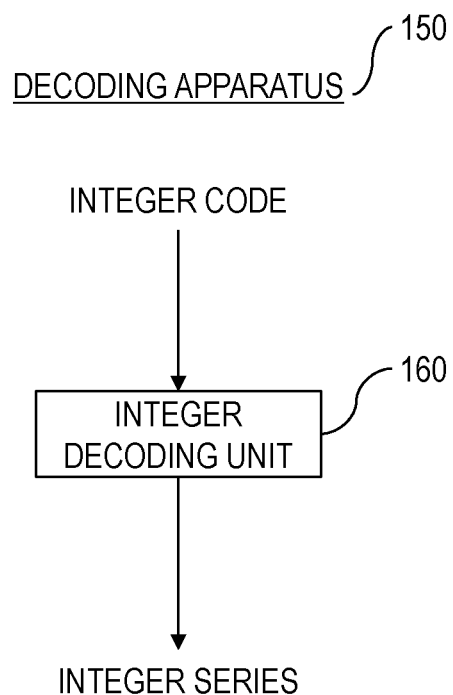
FIG. 7 is a block diagram showing an example of a configuration of a decoding apparatus 150.
Figure 8:
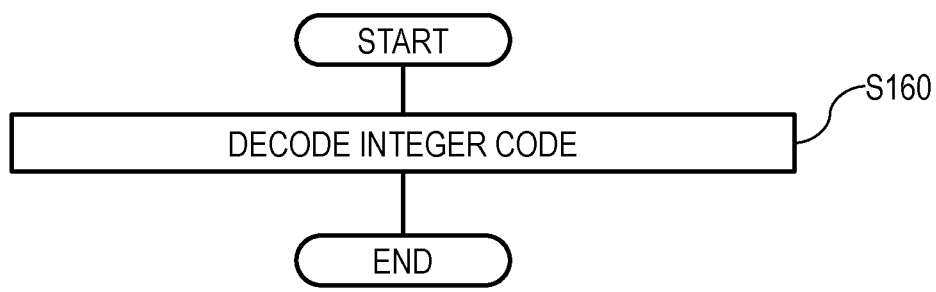
FIG. 8 is a flowchart showing an example of an operation of the decoding apparatus 150.

A processing procedure for a decoding method executed by the decoding apparatus 150 of the first embodiment will be described with reference to FIGS. 7 and 8. As shown in FIG. 7, the decoding apparatus 150 of the first embodiment includes an integer decoding unit 160. The decoding method of the first embodiment is realized due to the decoding apparatus 150 of the first embodiment executing the processing of the steps shown in FIG. 8.

The integer code output by the encoding apparatus 100 of the first embodiment is input to the decoding apparatus 150 of the first embodiment. The decoding apparatus 150 of the first embodiment decodes the input integer code using decoding processing in which multiple predetermined code trees corresponding to the encoding apparatus 100 of the first embodiment are used according to a predetermined rule corresponding to the encoding apparatus 100 of the first embodiment, and obtains a series of non-negative integer values, whereby the series of non-negative integer values that were input to the encoding apparatus 100 of the first embodiment are restored. Hereinafter, similarly to the description of the above-described encoding apparatus 100, the non-negative integer values will be referred to simply as "integer values" in the description.

[Integer Decoding Unit 160]

The integer code input to the decoding apparatus 150 is input to the integer decoding unit 160. Based on the encoding parameter K, which is the same value as the encoding parameter K used by the integer encoding unit 110 of the encoding apparatus 100, and is a natural number greater than or equal to 2, which was stored in advance in the integer decoding unit 160 or input through a means not shown in the drawings, the integer decoding unit 160 decodes the input integer codes with the decoding processing using the following code trees to obtain a series of integer values, and outputs the obtained integer series $x_1$, $x_2$, . . . , and $X_N$ (S160). Hereinafter, description will be given assuming that each integer of the integer series $x_1$, $x_2$, . . . , and $x_N$ is $x_n$ (n being a sample number in a series; n∈{1, 2, . . . , N}).

The code trees used in the decoding processing are the same as the code trees used by the integer encoding unit 110 of the encoding apparatus 100 of the first embodiment, and the $2^{K-1}$ (2 to the power of K−1) code trees illustrated in FIGS. 4 to 6 are stored in advance in the integer decoding unit 160. The rule in which the relationship between the input code and the integer values corresponding to the code in the code trees of the decoding processing and the multiple code trees is used corresponds to the rule in the encoding processing performed by the integer encoding unit 110 of the encoding apparatus 100 of the first embodiment, and is a rule in which "code allocated to the input integer value" of the rule in the encoding processing performed by the integer encoding unit 110 of the encoding apparatus 100 of the first embodiment is replaced with "input code", and "input integer values" are replaced with "integer values allocated to the input code", and the rule is stored in advance in the integer decoding unit 160. Note that the rule regarding which code tree is to be used first in the decoding processing is also the same as the rule used by the integer encoding unit 110 of the encoding apparatus 100 of the first embodiment, and is stored in advance in the integer decoding unit 160.

The integer decoding unit 160 uses the above-described multiple code trees to obtain a string of integer values corresponding to the input integer code according to the above-described rule in which the multiple code trees are used, and organizes the integers of the obtained string of integer values into a predetermined order to obtain and output the integer series $x_1$, $x_2$, . . . , and $x_N$. For example, the decoding procedure performed by the integer decoding unit 160 in the case where the predetermined order is the order of the sample numbers in the series and the code tree that is used first is T(0), is as indicated by the decoding procedure 1 or the decoding procedure 2 below.

(Decoding procedure 1-1) In the case where addition of an terminating code through encoding procedure step 4 has not been performed, that is, if the decoding apparatus 150 can specify the end of the integer code 1. If the code "1" has been removed in the encoding procedure step 3, the code "1" is added to the beginning of the integer code.

2. Set the initial value of the code tree number to 0.

3. Repeat (i) and (ii) below until there is no integer code that has not been read, and when there is no integer code that has not been read, proceed to step 4.

(i) Read the input integer code in order while there is a code that corresponds to the read code in the code tree corresponding to the code tree number (i.e., until one bit before the code corresponding to the read code in the code tree corresponding to the code tree number ends).

(ii) Obtain the integer value corresponding to the code corresponding to the read code from the code tree corresponding to the code tree number, and obtain a new code tree number according to the code tree transition rule for the integer value of the code tree.

4. Output the series of integer values obtained in (ii) of step 3 as the integer series $x_1, x_2, \ldots,$ and $x_N$.

(Decoding procedure 1-2) In the case where addition of the terminating code through step 4 of the encoding procedure has been performed, that is, if the decoding apparatus 150 cannot specify the end of the integer code 1. If the code "1" has been removed in step 3 of the encoding procedure, add the code "1" to the beginning of the input code string (code string including the integer code and another subsequent code).

2. Set the initial values of the sample number n and the code tree number to 1 and 0 respectively.

3. Repeat (i) and (ii) below until n=N is satisfied.

(i) Read the input code string in order while there is a code corresponding to the read code in the code tree corresponding to the code tree number (i.e., until one bit before the code corresponding to the read code in the code tree corresponding to the code tree number ends).

(ii) Obtain the integer value corresponding to the code corresponding to the read code from the code tree corresponding to the code tree number, obtain a new code tree number according to the code tree transition rule for the integer value of the code tree, and set the result of adding 1 to n as the new n.

4. Output the series of integer values obtained in (ii) of step 3 as the integer series $x_1, x_2, \ldots,$ and $x_N$.

(Decoding Procedure 2)

1. If addition of the terminating code has not been performed in step 4 of the encoding procedure, add the terminating code "1" to the end of the input code string. Also, if the code "1" was not removed in step 3 of the encoding procedure, remove the code "1" from the beginning of the input code string.

2. Set the initial values of the sample number n and the code tree number to 1 and 0 respectively.

3. Repeat (i) to (v) below until n Z N is satisfied.

(i) Read out K bits'-worth of the input code string in order while all of the K bits are the code "0", and set a value obtained by dividing the number of codes "0" read in that period by K as Z.

(ii) If the code tree number is 0, obtain the integer value Z.

(iii) If the code tree number is not 0, obtain the integer value (Z+1).

(iv) If the next 1 bit of the input code string is "1", read that 1 bit, obtain ($2^{K-1}-1$) integer values 0, set 0 as the new code tree number, and set the result of adding $2^{K-1}$ to n as the new n.

(v) If the next 1 bit of the input code string is the code "0", read K bits including the 1 bit, set the number of the code tree corresponding to the remaining K−1 bits from which the first 1 bit of the K bits has been removed as the new code tree number, obtain (new code tree number−1) integer values 0, and set the result of adding the new code tree number to n as the new n.

4. If the number of obtained integer values is greater than N, the (N+1)-th integer value and onward are removed.

[[Example of Decoding Processing]]

Decoding processing performed in the case where the integer code "100001" obtained in the above-described example of encoding processing is to be decoded using the above-described decoding procedure 1-1 when K=2 is satisfied and the code tree to be used first is T(0) will be described as an example of decoding processing. First, the code "1" is added to the front of the integer code "100001" to obtain the integer code "1100001". Next, although "1", which is the first bit of the integer code "1100001", has a code corresponding to the code tree T(0), "11", which is the first 2 bits, has no code corresponding to the code tree T(0), and therefore "1", which is the first 1 bit of the integer code, is read, the integer value 0 corresponding to "1" is obtained, and the code tree to be used next is set to T(1). Next, "1", which is the first 1 bit of the remaining integer code "100001" has no code corresponding to the code tree T(1), and therefore the first bit is not read, the integer value 0 corresponding to 0 bits is obtained, and the code tree to be used next is set to T(0). Next, although "1", which is the first 1 bit of the remaining integer code "100001", to "10000", which are the first 5 bits, have corresponding codes in the code tree T(0), "100001", which is the first 6 bits of the remaining integer code "100001" has no corresponding code in the code tree T(0), and therefore "10000", which is the first five bits of the remaining integer code "100001", is read, the integer value 2 corresponding to "10000" is obtained, and the code tree to be used next is set to T(1). Next, due to the fact that "1", which is the remaining integer code, has no corresponding code in the code tree T(1), the first 1 bit is not read, and the integer value 0 corresponding to 0 bits is obtained, and the code tree to be used next is set to T(0). Next, due to the fact that "1", which is the remaining integer code, has a corresponding code in the code tree T(0) and there is no integer code that has not been read after this "1", the integer value 0 corresponding to "1" is obtained, and the series composed of the integer values 0, 0, 2, 0, and 0 obtained through these steps of processing is output as the integer series $x_1, x_2, x_3, x_4,$ and $x_5$.

According to the embodiment of the present invention, it is possible to perform encoding with a low average bit count even for a series of integer values that are significantly biased at small values including small values that are not zero values, or a series of integer values with values that are biased such that it cannot be completely handled using the technique of NPL 2. Also, this kind of code can be decoded.

Description of Principle of Invention of First Embodiment

Here, the principle of the present invention will be described.

According to the encoding apparatus 100 of the first embodiment, it is possible to allocate codes to all non-negative integer values and the non-negative integer values can be restored due to the decoding apparatus 150 of the first embodiment decoding the code. As shown in FIGS. 4 to 6, the code corresponding to the non-negative integer value $x_n$ is $K \times x_n$ bits or $K \times x_n + 1$ bits. Due to this, the code of the present invention used in the first embodiment is a code that applies an approximately optimal expected bit length to a series of non-negative integer values that follow an exponential distribution (one-sided Laplace distribution) with a large bias shown in Expression (3) below, and is a code that can reduce the average bit count for a series of non-negative integer values that is significantly biased toward small values, relative to a Golomb code or a Golomb-Rice code.

[Formula 3]

$$p(x, 2^{-K}) = (1 - 2^{-K}) \cdot 2^{-Kx} \quad (3)$$

It is understood that the inverse of the encoding parameter K of the present invention corresponds to a Golomb parameter s based on the correspondence relationship between the distribution $p(x, 2^{-1/s})$ for which the Golomb code shown in Expression (2) is optimal, and the distribution $p(x, 2^{-K})$ for which the code of the present invention shown in Expression (3) is optimal. Also, due to the fact that the encoding parameter K of the present invention is a positive integer value, the inverse of the encoding parameter K is a value that is less than 1, and therefore the encoding parameter K can be interpreted as a parameter that corresponds to a Golomb parameter expanded to values that are greater than 0 and less than 1. Also, the Rice parameter r corresponds to a logarithmic value of the Golomb parameter s, and therefore the encoding parameter K can similarly be interpreted also as a parameter that corresponds to a Rice parameter expanded to negative values. That is, by performing estimation of the Golomb parameter or the Rice parameter that is optimal for the series of non-negative integer values, it is possible to estimate the optimal parameter K in the code of the present invention that is allocated to the series of non-negative integer values.

The relationship between the integer values and the codes corresponding to the integer values in the code trees of the present invention used by the encoding apparatus 100 and the decoding apparatus 150 of the first embodiment and the rule in which multiple code trees are used are designed with consideration given to not only setting the code corresponding to the non-negative integer value $x_n$ to $K \times x_n$ bits or $K \times x_n + 1$ bits, but also to making the code decodable. Specifically, a restriction is provided in which "1", which is a 1-bit code, is allocated to $2^{K-1}$ consecutive integer values 0, and a code in which at least a 1-bit value "1" is included among the first K bits and the bit values of the (K+1)-th bit and onward are "0" is allocated to 0 to $2^{K-1}-1$ consecutive integer values 0 and one non-negative integer value $x_n \neq 0$ subsequent thereto. By providing this restriction, it is understood that when the integer code corresponding to the integer series composed of the multiple integer values is read by the decoding apparatus 150, a boundary between a certain code in the integer code and one code subsequent thereto are included in the portion in which the bit value "1" is included in the K bits. Note that since the above-described restriction is satisfied, the bit count of the code with respect to 0 to $2^{K-1}-1$ consecutive integer values 0 and one non-negative integer value $x_n$ subsequent thereto is not only $K \times x_n$ bits, but is $K \times x_n$ bits or $K \times x_n + 1$ bits.

Second Embodiment

In the first embodiment, a mode was described in which encoding and decoding of the present invention are realized using predetermined code trees, but encoding processing and decoding processing that are equivalent to those of the first embodiment can be realized also by using predetermined correspondence tables instead of the predetermined code trees. The mode in which the predetermined correspondence tables are used will be described as a second embodiment.

<<Encoding Apparatus>>

A processing procedure of an encoding method executed by an encoding apparatus 100 of a second embodiment will be described with reference to FIGS. 2 and 3. As shown in FIG. 2, the encoding apparatus 100 of the second embodiment includes an integer encoding unit 110. The encoding method of the second embodiment is realized due to the encoding apparatus 100 of the second embodiment executing the processing of the steps shown in FIG. 3.

Similarly to the first embodiment, a series of non-negative integer values are input to the encoding apparatus 100 of the second embodiment. The encoding apparatus 100 of the second embodiment follows pre-determined correspondence tables to perform variable-length encoding of a series of non-negative integer values, thereby realizing encoding processing in which a shorter bit length than in Golomb encoding and Golomb-Rice encoding is achieved for a series of non-negative integer values of a distribution with a more significant bias than an exponential distribution envisioned by Golomb encoding and Golomb-Rice encoding. Hereinafter, non-negative integer values input to the encoding apparatus 100 will be called "integer values" in the description.

[Integer Encoding Unit 110]

An integer series $x_1, x_2, \ldots, x_N$ of N samples among a series of integer values input to the encoding apparatus 100 is input to the integer encoding unit 110. The integer encoding unit 110 of the second embodiment encodes the input integer series $x_1, x_2, \ldots, x_N$ based on correspondence tables that were created in advance corresponding to the encoding parameter K, which is a natural number greater than or equal to 2, and were stored in the integer encoding unit 110, obtains a code, and outputs the obtained code as the integer code (S110).

[[Correspondence Tables Used in Encoding Processing]]

The correspondence tables stored in advance store a rule of a correspondence relationship between a partial series of integer values composed of a combination of consecutive zero values (0 or more consecutive zero values) and one non-zero value, and a code corresponding to the partial series. Examples of correspondence tables in which K=2 and K=3 are satisfied are shown in FIGS. 9 and 10. The rule stored in the correspondence tables is a rule in which a 1-bit code with a bit value of "1" is allocated to the partial series composed of $2^{K-1}$ consecutive zero values, and a $K \times x_n$-bit or $K \times x_n + 1$-bit code is allocated to a combination of consecutive zero values and a non-zero value $x_n$ in the other partial series, that is, the partial series composed of 0 to $2^{K-1}-1$ consecutive zero values and one non-zero value $x_n$ subsequent thereto.

In the illustrated correspondence table, this is a rule in which a code in which there is at least one bit "1" in the first K bits and the remaining $K \times (x_n - 1)$ bits or $K \times (x_n - 1) + 1$ bits are all "0" is allocated to each partial series composed of 0 to $2^{K-1}-1$ consecutive zero values and one non-zero value $x_n$ subsequent thereto. More specifically, with this rule, a $K \times x_n + 1$-bit code in which the bit value of the first bit is "1", the bit values of the second bit to the K-th bit are all "0", and the bit values of the (K+1)-th bit to the $(K \times x_n + 1)$-th bit are all "0", or a $K \times x_n$-bit code in which the bit value of the first bit is "0", the bit value of at least one bit among K−1 bits from the second bit to the K-th bit is "1", and the bit values of the (K+1)-th bit to the $(K \times x_n)$-th bit are all "0" is allocated to the partial series composed of 0 to $2^{K-1}-1$ consecutive zero values and one non-zero value. Even more specifically, with this rule, the $2K-1$ partial codes composed of the 1 partial code from the first bit to the (K+1)-th bit in which the bit value of the first bit of the $K \times x_n + 1$-bit code is "1" and the second bit to the (K+1)-th bit are "0" and the $2^{K-1}-1$ partial codes from the first bit to the K-th bit in which the bit value of the first bit of the $K \times x_n$-bit code is "0" and at least one bit among the K−1 bits from the second bit to the K-th bit is "1", and the $2^{K-1}$ numbers of 0 to $2^{K-1}-1$ consecutive zero values are in one-to-one correspondence.

[[Encoding Processing Using Correspondence Table]]

The integer encoding unit 110 uses the above-described correspondence tables to encode the integer values included in the input integer series $x_1, x_2, \ldots,$ and $x_N$ in a predetermined order and obtain a code, and outputs the obtained code as the integer code. For example, an encoding procedure performed by the integer encoding unit 110 in the case where the predetermined order is a sample number order in the series is as described below.

(Encoding Procedure)

1. The sample number n is set to 1.
2. Repeat (i) and (ii) below until n=N is satisfied.
(i) If there is a non-zero value among the $2^{K-1}$ integer values of $x_n$ and onward, obtain a code corresponding to the partial series up to the first non-zero value of $x_n$ and onward from a code table, and set the result of adding n to the sample count up to the first non-zero value of $x_n$ and onward as the new n.
(ii) If all of the $2^{K-1}$ integer values of $x_n$ and onward are zero values, obtain the code corresponding to the partial series of $2^{K-1}$ integer values of $x_n$ and onward from the code table and set the result of adding $2^{K-1}$ to n as the new n.
3. Add the code "1" (terminating code) to the end of the code obtained through step 2.
4. Output the code obtained through step 3 as the integer code.

Note that, similarly to the first embodiment, depending on how the integer code is transmitted from the encoding apparatus 100 to the decoding apparatus 150, the processing for adding the terminating code (step 3 of the encoding procedure) may also not be performed.

Note that the codes obtained through the encoding processing using FIGS. 9 and 10 in the integer encoding unit 110 of the encoding apparatus 100 of the second embodiment match the codes obtained when the code tree to be used first is T(1) in the encoding processing using the code trees in FIGS. 4 and 5 in the integer encoding unit 110 of the encoding apparatus 100 of the first embodiment. Also, in the integer encoding unit 110 of the encoding apparatus 100 of the second embodiment, when encoding is performed using FIGS. 9 and 10, as long as encoding is performed after adding $(2^{K-1}-1)$ zero values to the front of the input integer series $x_1, x_2, \ldots,$ and $x_N$ and the code "1", which is the front of the obtained integer code, is removed, the code matches the code obtained when the code tree to be used first is T(0) in the encoding processing using the code trees of FIGS. 4 and 5 in the integer encoding unit 110 of the encoding apparatus 100 of the first embodiment. In this manner, the encoding processing using the correspondence tables in the integer encoding unit 110 of the encoding apparatus 100 of the second embodiment is equivalent to the encoding processing performed using the code trees in the integer encoding unit 110 of the encoding apparatus 100 of the first embodiment.

<<Decoding Apparatus>>

A processing procedure for a decoding method executed by the decoding apparatus 150 of the second embodiment will be described with reference to FIGS. 7 and 8. As shown in FIG. 7, the decoding apparatus 150 of the second embodiment includes an integer decoding unit 160. The decoding method of the second embodiment is realized due to the decoding apparatus 150 of the second embodiment executing the processing of the steps shown in FIG. 8.

Similarly to the decoding apparatus 150 of the first embodiment, the integer code output by the encoding apparatus 100 of the second embodiment is input to the decoding apparatus 150 of the second embodiment. The decoding apparatus 150 of the second embodiment restores the series of non-negative integer values input to the encoding apparatus 100 of the second embodiment by decoding the input integer code through decoding processing using the same correspondence tables as the correspondence tables stored in the integer encoding unit 110 of the encoding apparatus 100 of the second embodiment and obtaining a series of non-negative integer values. Hereinafter, similarly to the description of the above-described encoding apparatus, the non-negative integer values will be referred to simply as "integer values" in the description.

[Integer Decoding Unit 160]

The integer code input to the decoding apparatus 150 is input to the integer decoding unit 160. Based on correspondence tables that are created in advance and stored in the integer decoding unit 160, the correspondence tables being pre-created correspondence tables that correspond to an encoding parameter K and are the same as the correspondence tables that were stored in advance in the integer encoding unit 110 of the encoding apparatus 100 and were used by the integer encoding unit 110, the integer decoding unit 160 decodes the input integer code to obtain and output the integer series $x_1, x_2, \ldots,$ and $x_N$ (S160).

More specifically, the integer decoding unit 160 outputs, as the integer series $x_1, x_2, \ldots,$ and $x_N$, a series composed of partial series of integers obtained by repeatedly performing, from the beginning to the end of the input integer code, processing for reading code portions that have not yet been read in the input integer code from the beginning to a portion including a code corresponding to the correspondence table, and obtaining a partial series of integers corresponding to read code from the correspondence table. Through this decoding processing, it is possible to obtain the integer series $x_1, x_2, \ldots,$ and $x_N$ that is the same as in the case where the code tree to be used first is T(1) in the decoding processing using the code trees of FIGS. 4 and 5 in the integer decoding unit 160 of the decoding apparatus 150 of the first embodiment.

Note that if encoding has been performed after adding the $(2^{K-1}-1)$ zero values to the front of the input integer series $x_1, x_2, \ldots,$ and $x_N$ and processing for removing the code "1" at the front of the obtained integer code has been performed in the integer encoding unit 110 of the encoding apparatus 100, the integer decoding unit 160 need only obtain the partial series using the above-described decoding processing based on the above-described correspondence tables after adding the code "1" to the front of the input integer code, omit the $(2^{K-1}-1)$ zero values obtained first, and thereafter output the integer series $x_1, x_2, \ldots,$ and $x_N$ composed of the partial series. Through this decoding processing, it is possible to obtain the integer series $x_1, x_2, \ldots,$ and $x_N$ that is the same as in the case where the code tree to be used first is T(0) in the decoding processing using the code trees of FIGS. 4 and 5 in the integer decoding unit 160 of the decoding apparatus 150 of the first embodiment. In this manner, the decoding processing performed using the correspondence tables in the integer decoding unit 160 of the decoding apparatus 150 of the second embodiment is equivalent to the decoding processing performed using the code trees in the integer decoding unit 160 of the decoding apparatus 150 of the first embodiment.

As can be understood from the description above, the integer code obtained by the encoding apparatus 100 of the first embodiment through the encoding processing performed using the code trees may also be decoded by the decoding apparatus 150 of the second embodiment through the decoding processing performed using the correspondence tables corresponding to the encoding processing to obtain the integer series $x_1, x_2, \ldots, x_N$, and the integer code obtained by the encoding apparatus 100 of the second embodiment through the encoding processing performed using the correspondence tables may also be decoded by the decoding apparatus 150 of the first embodiment through the decoding processing performed using the code trees corresponding to the encoding processing to obtain the integer series $x_1, x_2, \ldots, x_N$.

According to the embodiment of the present invention, it is possible to perform encoding with a low average bit count even for a series of integer values that are significantly biased at small values including small values that are not zero values, or a series of integer values with values that are biased such that it cannot be completely handled with the technique of NPL 2. Also, this kind of code can be decoded.

Third Embodiment

The rule of the codes of the first embodiment and the second embodiment is a rule in which "1", which is a one-bit code, corresponds to the $2^{K-1}$ consecutive integer values 0, and with respect to 0 to $2^{K-1}-1$ consecutive integer values 0 and one non-negative integer value $x_n \neq 0$ subsequent thereto, $2^1-1$ partial codes composed of one partial code from a first bit to a (K+1)-th bit, in which the bit value of the first bit of the K×$x_n$+1-bit code is "1", and the second bit to the (K+1)-th bit are "0", and $2^{K-1}-1$ partial codes from a first bit to a K-th bit, in which the bit value of the first bit of the K×$x_n$-bit code is "0", and the bit value of at least one bit among the K−1 bits from the second bit to the K-th bit is "1", are in one-to-one correspondence with the $2^K-1$ numbers of 0 to 2K−1−1 consecutive integer values 0. Here, with attention given to the number of consecutive integer values 0, the code of the first embodiment and the second embodiment can express 0 to $2^{K-1}$ consecutive integer values 0 with respect to an encoding parameter K, which is a natural number greater than or equal to 2. That is, in the first embodiment and the second embodiment, the maximum number of consecutive integer values 0 is an integer power of 2.

In the code of the first embodiment and the second embodiment, when a series of inputs x following an exponential distribution obtained using non-negative values K', such as $p(x, 2^{-K'})$ is applied, if K' is an integer value, the encoding parameter K is set such that K=K' is satisfied, and the maximum number of consecutive integer values 0 that can be expressed is 2 to the power of K', whereby it is possible to realize the approximate optimal compression efficiency. However, if K' above is not an integer value and has a value between the encoding parameter K and (K+1), a higher compression efficiency is achieved by being able to realize a greater number of consecutive integer values 0 than in the case where the encoding parameter K is set such that K=K' is satisfied. On the other hand, in this case, the appearance frequency of the integer value 0 is not high enough to double the maximum consecutive number of integer values 0 that can be expressed by adding 1 to the encoding parameter K, and on the contrary, the bit count for expressing the non-zero values increases, causing a decrease in the compression efficiency.

In view of this, in the present embodiment, a mode will be described in which the first embodiment is modified such that the compression efficiency increases even if the maximum number of consecutive integer values 0 is not an integer power of 2.

<<Encoding Apparatus>>

A processing procedure of an encoding method executed by an encoding apparatus 100 of a third embodiment will be described with reference to FIGS. 2 and 3. As shown in FIG. 2, the encoding apparatus 100 of the third embodiment includes an integer encoding unit 110. The encoding method of the third embodiment is realized due to the encoding apparatus 100 of the third embodiment executing the processing of the steps shown in FIG. 3.

Similarly to the first embodiment and the second embodiment, a series of non-negative integer values are input to the encoding apparatus 100 of the third embodiment.

Similarly to the encoding apparatus 100 of the first embodiment, the encoding apparatus 100 of the third embodiment uses multiple pre-determined code trees in accordance with a pre-determined rule, and performs variable-length encoding of a series of non-negative integer values, thereby realizing encoding processing in which a shorter bit length than in Golomb encoding and Golomb-Rice encoding is achieved for a series of non-negative integer values of a distribution with a more significant bias than an exponential distribution envisioned by Golomb encoding and Golomb-Rice encoding. Hereinafter, non-negative integer values input to the encoding apparatus 100 will be called "integer values" in the description.

[Integer Encoding Unit 110]

A series composed of integer values of N samples (N being a natural number) in a series of integer values input to the encoding apparatus 100 is input to the integer encoding unit 110. The input series of integer values is the integer series $x_1, x_2, \ldots,$ and $x_N$. Based on an encoding parameter L, which is a natural number greater than or equal to 2 that is stored in advance in the integer encoding unit 110 or input through means not shown in drawings, the integer encoding unit 110 encodes the integer series $x_1, x_2, \ldots, x_N$ through encoding processing using the code trees below to obtain a code, and outputs the obtained code as an integer code (S110). Hereinafter, description will be given assuming that each integer of the integer series $x_1, x_2, \ldots,$ and $x_N$ is $x_n$ (n being a sample number in a series; $n \in \{1, 2, \ldots, N\}$).

Also, hereinafter, description will be given using K, which is the smallest natural number at which $2^K$ is greater than L, p, which is a natural number obtained by subtracting L from $2^K$, and q, which is a natural number obtained by subtracting $2^{K-1}$ from L. Although K, p, and q are values that can be expressed using L and are used for convenience in order to simplify the description, they may also be used by the integer encoding unit 110 in actuality. If the integer encoding unit 110 is to use K, p, or q, the values of K, p, and q may also be obtained by the integer encoding unit 110 performing calculation using the encoding parameter L, the values of K, p, and q may also be input together with the encoding parameter L through a means not shown in the drawings, and if the encoding parameter L is stored in advance in the integer encoding unit 110, the values of K, p, and q may also be stored in advance in the integer encoding unit 110.

[[Code Trees Used in Encoding Processing]]

First, an example of the code trees used in the encoding processing of the integer encoding unit 110 will be described.

Figure 11:
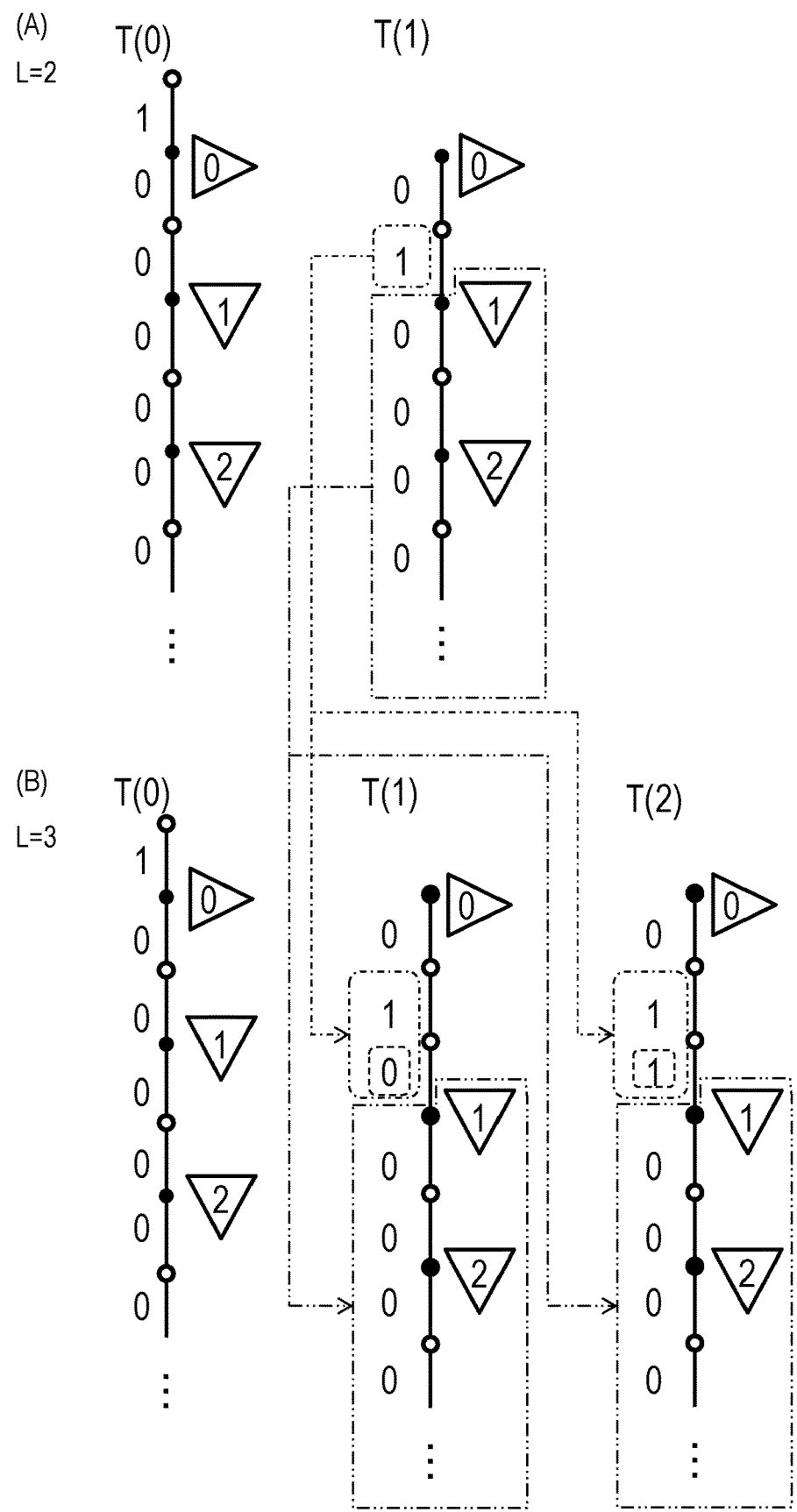
FIG. 11 is a diagram showing an example of code trees used when L=2 or L=3.
Figure 12:
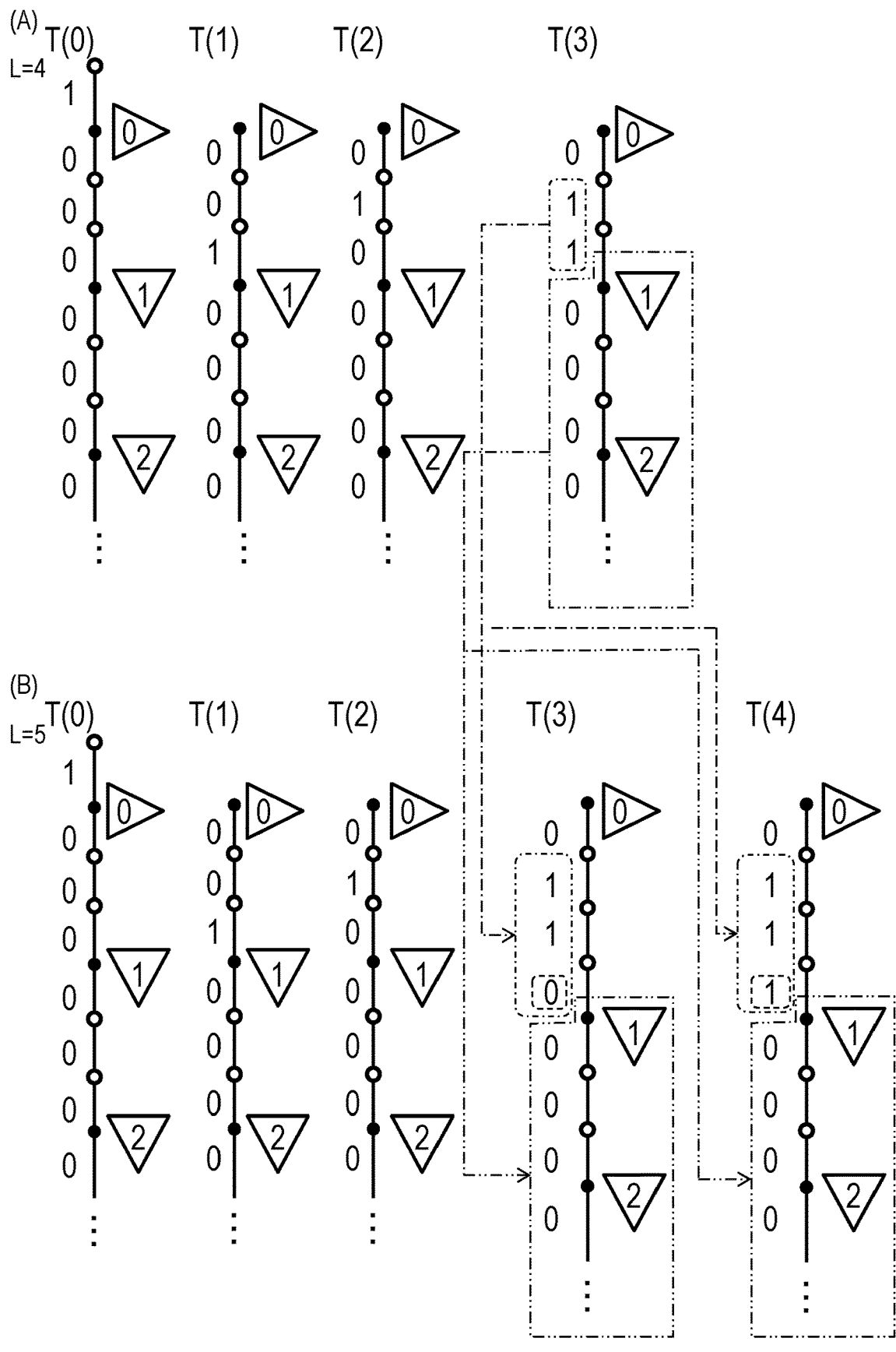
FIG. 12 is a diagram showing an example of code trees used when L=4 or L=5.
Figure 13:
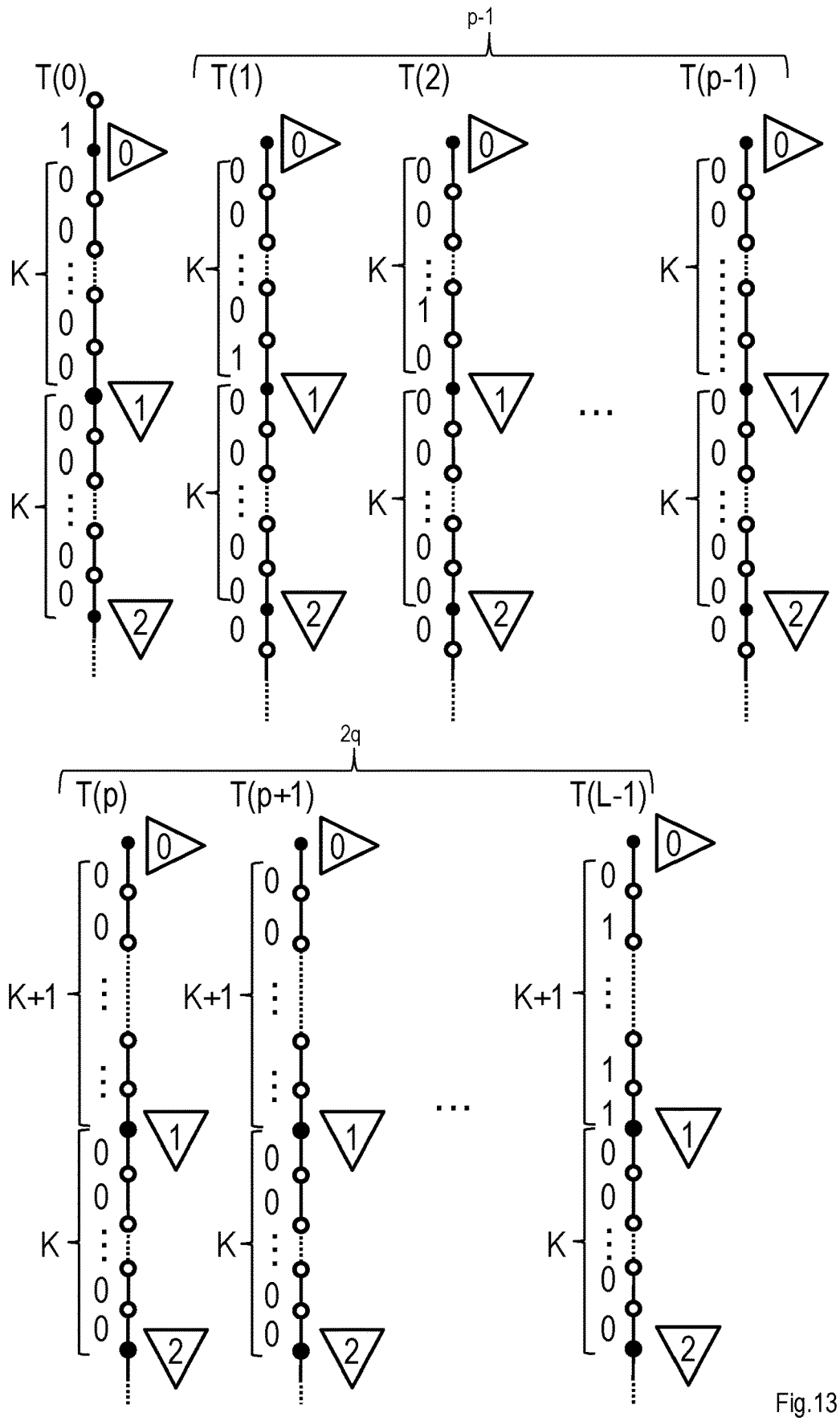
FIG. 13 is a diagram showing an example of code trees used when L is generalized.

L code trees illustrated in FIGS. 11 to 13 are stored in advance in the integer encoding unit 110. FIG. 11(A) is an example of code trees used when L=2, T(0) and T(1) being code trees, and FIG. 11(B) is an example of code trees used when L=3, T(0) to T(2) being code trees. FIG. 12(A) is an example of code trees used when L=4, T(0) to T(3) being code trees, and FIG. 12(B) is an example of code trees used when L=5, T(0) to T(4) being code trees. FIG. 13 is an example of code trees used when L is generalized, T(0) to T(L−1) being code trees.

[[Relationship Between Input Integer Value and Code Corresponding to Integer Value in Code Tree]]

Next, a relationship between an input integer value and a code corresponding to that integer value in each code tree will be described.

The integer values surrounded by the triangles on the right side of the nodes of each code tree correspond to input integer values. Also, the bit values "0" and "1" on the left side of the edge of each code tree correspond to the rule of the codes to be allocated to the input integer values. This rule is a rule in which bit values aligned on the left side of the edge from the node on the upper end of the code tree up to the node corresponding to the input integer value are obtained as the code to be allocated to the input integer value.

One of the L code trees corresponds to T(0) in FIGS. 11 to 13, and is a code tree corresponding to a rule for obtaining a code in which the bit count is $K \times x_n + 1$, the bit value of the first bit is "1", and the bit values of second bit to the $(K \times x_n + 1)$-th bit is "0" as the code corresponding to the input integer value $x_n$. Note that according to this code tree, if the input integer value $x_n$ is 0, the bit count $K \times x_n + 1$ of the code is 1 bit, and therefore a 1-bit code for which the bit value is "1" is obtained. That is, T(0) of the present embodiment is the same as T(0) of the first embodiment.

The other L−1 code trees of the L code trees correspond to T(1) to T(L−1) of FIGS. 11 to 13. These code trees will be described hereinafter in comparison to the first embodiment.

The $2^{K-1}-1$ code trees from T(1) to T($2^{K-1}-1$) of the first embodiment shown in FIGS. 4 to 6 are code trees that correspond to a rule for obtaining, as the code corresponding to the input non-zero value $x_n$, a code in which the K−1 bits from the second bit to the K-th bit are a group of bits that are in one-to-one correspondence with the $2^{K-1}-1$ code trees from T(1) to T($2^{K-1}-1$), and are a group of bits that are in one-to-one correspondence with the number $2^{K-1}-1$ of consecutive input zero values until immediately before the input non-zero value $x_n$. As described above, in order to achieve a decodable code, the bit value of at least 1 bit of the K−1 bits from the second bit to the K-th bit needs to be "1", and therefore the number of consecutive zero values that can be expressed using the K−1 bits from the second bit to the K-th bit is, at most, $2^{K-1}-1$. For example, if K=2 is satisfied, the number of consecutive zero values that can be expressed by the second bit is, at most, 1. Also, for example, if K=3 is satisfied, the number of consecutive zero values that can be expressed by the second and third bits is, at most, 3.

If the encoding parameter L is 2, the number of consecutive zero values to be expressed with the L−1 code trees other than T(0) is 1, and therefore as shown in FIG. 11(A), it is sufficient to use a code tree that is the same as the code tree T(1) of the first embodiment shown in FIG. 4 as T(1) of the present embodiment.

On the other hand, if the encoding parameter L is 3, the number of consecutive zero values to be expressed using the L−1 code trees other than T(0) is 2, and therefore the number of consecutive zero values to be expressed with only the second bit is 1 too few. In view of this, in the present embodiment, if the encoding parameter L is 3, two code trees T(1) and T(2) are used which have configurations in which, as indicated surrounded by the two-dot chain line in FIG. 11, the third bit and onward of the code tree T(1) in the case where the encoding parameter L is 2 are shifted by one bit to be the fourth bit and onward, and, as indicated surrounded by the one-dot chain line in FIG. 11, one bit is added as the third bit after the second bit of the code tree T(1) used in the case where the encoding parameter L is 2. In the code trees T(1) and T(2), as indicated by the broken lines in FIG. 11(B), the bits added as the third bits have mutually different values.

Also, if the encoding parameter L is 4, the number of consecutive zero values to be expressed using the L−1 code trees other than T(0) is 3, and therefore as shown in FIG. 12(A), it is sufficient to use the same code trees as the code trees T(1) to T(3) of the first embodiment shown in FIG. 4 as T(1) to T(3) of the present embodiment.

On the other hand, if the encoding parameter L is 5, the number of consecutive zero values to be expressed using the L−1 code trees other than T(0) is 4, and therefore the number of consecutive zero values to be expressed using only the second and third bits is 1 too few. In view of this, in the present embodiment, if the encoding parameter L is 5, two code trees T(3) and T(4) are used which have configurations in which, as indicated surrounded by the two-dot chain line in FIG. 12, the fourth bit and onward of the code tree T(3) used in the case where the encoding parameter L is 4 are shifted by one bit to be the fifth bit and onward, and as indicated surrounded by the one-dot chain line in FIG. 12, one bit is added as the fourth bit after the third bit of the code tree T(3) used in the case where the encoding parameter L is 4. In the code trees T(3) and T(4), as indicated by the broken lines in FIG. 12(B), the bits added as the fourth bits have mutually different values.

Hereinafter, the encoding parameter L will be described in a generalized manner. The number of consecutive zero values that can be expressed using the K−1 bits from the second bit to the K-th bit of the L−1 code trees other than T(0) is, at most, $2^{K-1}-1$. If the encoding parameter L is $2^{K-1}$, the number of consecutive zero values to be expressed using the L−1 code trees other than T(0) is $L-1=2^{K-1}-1$, and therefore it is sufficient to use the same code trees as the code trees T(1) to T($2^{K-1}-1$) of the first embodiment shown in FIG. 6 as T(1) to T(L−1) of the present embodiment.

On the other hand, if the encoding parameter L is a value that is greater than $2^{K-1}$, the number of consecutive zero values to be expressed using the L−1 code trees other than T(0) is L−1, and due to the fact that it is greater than the maximum number $2^{K-1}-1$ of consecutive zero values that can be expressed by the K−1 bits from the second bit to the K-th bit by $(L-1)-(2^{K-1}-1)=L-2^{K-1}=q$, the number of consecutive zero values to be expressed using only the K−1 bits from the second bit to the K-th bit is q too few. In view of this, in the present embodiment, as shown in the lower portion of FIG. 13, $2q=2\times(L-2^{K-1})=2L-2^K$ code trees are used which are obtained by replacing each of $q=L-2^{K-1}$ code trees among the code trees T(1) to T($2^{K-1}-1$) of the first embodiment shown in FIG. 6 with two code trees, namely, a code tree in which the (K+1)-th bit and onward are shifted one bit to be the (K+2)-th bit and onward and one bit with a bit value of "0" is added as the (K+1)-th bit, and a code tree in which the (K+1)-th bit and onward are shifted one bit to be the (K+2)-th bit and onward and one bit with a bit value of "1" is added as the (K+1)-th bit. Note that in the present embodiment, as shown in the upper portion of FIG. 13, the code trees of the first embodiment shown in FIG. 6 are used as the $(2^{K-1}-1)-q=2^{K-1}-1-(L-2^{K-1})=2^{K-1}-L-1=p-1$ code trees, which are the remaining code trees among T(1) to T($2^{K-1}$−1). However, in the present embodiment, since p−1=0 is satisfied depending on the value of the encoding parameter L, there are cases in which only the replaced code trees are used and the code trees of the first embodiment shown in FIG. 6 that have not been subjected to replacement are not used. Note that if the encoding parameter L is $2^{K-1}$, due to the fact that q=0 is satisfied, it can be said that only the code trees of the first embodiment shown in FIG. 6 that were not subjected to replacement would be used without performing replacement of the code trees.

That is, the L−1 code trees T(1) to T(L−1) among the L code trees of the present embodiment do not obtain a code if the input integer value $x_n$ is 0, and obtain a code in which the bit count is K×$x_n$ bits or K×$x_n$+1 bits, the bit value of the first bit is "0", the bit value of at least one bit among the K−1 bits from the second bit to the K-th bit is "1", and the bit values of the K×($x_n$−1) bits from the end are "0" if the input integer value $x_n$ is not 0. More specifically, the p−1 code trees among the L−1 code trees T(1) to T(L−1) obtain a code in which the bit count is K×$x_n$ bits if the input integer value $x_n$ is not 0, and the 2q code trees among the L−1 code trees T(1) to T(L−1) obtain a code in which the bit count is K×$x_n$+1 if the input integer value $x_n$ is not 0.

Also, the K−1 bits from the second bit to the K-th bit of the code in which the bit count is K×$x_n$ bits in the case where the input integer value $x_n$ is not 0, and the K bits from the second bit to the (K+1)-th bit of the code in which the bit count is K×$x_n$+1 bits in the case where the input integer value $x_n$ is not 0 are in one-to-one correspondence with the L−1 code trees T(1) to T(L−1). More specifically, p−1 patterns of the $2^{K-1}$ patterns that can be expressed using the K−1 bits from the second bit to the K-th bit, in which the bit value of at least one bit is "1" in the case where the input integer value $x_n$ is not 0 are in one-to-one correspondence with the p−1 code trees that obtain a code in which the bit count is K×$x_n$ bits when the input integer value $x_n$ is not 0, and 2q patterns, which are sets of q patterns other than the above-described p−1 patterns of the $2^{K-1}$ patterns that can be expressed using the K−1 bits from the second bit to the K-th bit in which the bit value of at least 1 bit is "1" in the case where the input integer value $x_n$ is not 0, and the bit value of the (K+1)-th bit in the case of using these q patterns are in one-to-one correspondence with the 2q code trees for obtaining a code with a bit count of K×$x_n$+1 in the case where the input integer value $x_n$ is not 0. More specifically, the above-described q patterns of K−1 bits from the second bit to the K-th bit are in one-to-one correspondence with each of the q sets of two of the 2q code trees that obtain a code in which the bit count is K×$x_n$+1 in the case where the input integer value $x_n$ is not 0, and the bit value of the (K+1)-th bit corresponds to one of the sets of two code trees. For example, in the example of FIG. 13, the p−1 patterns of the $2^{K-1}$ patterns that can be expressed using K−1 bits from the second bit to the K-th bit in which the bit value of at least one bit is "1" in the case where the input integer value $x_n$ is not 0 are K bits that are in one-to-one correspondence with the p−1 code trees T(1) to T(p−1), and the 2q patterns, which are a set of the q patterns other than the above-described p−1 patterns among the $2^{K-1}$ patterns that can be expressed using the K−1 bits from the second bit to the K-th bit in which the bit value of at least one bit is "1" in the case where the input integer value $x_n$ is not 0, and the bit value of (K+1)-th bit in the case of using these q patterns, are K+1 bits that are in one-to-one correspondence with the 2q code trees T(p) to T(L−1).

[[Rule in which Multiple Code Trees are Used]]

Next, a rule in which multiple code trees are used will be described. The rule in which multiple code trees are used is also stored in advance in the integer encoding unit 110.

The directions of the triangles surrounding the integer values on the right side of the nodes of the code trees in FIGS. 11 to 13 correspond to the rule in which multiple code trees are used.

The rightward triangle indicates a rule in which the code tree adjacent to the right (the code tree whose code tree number is one larger) is used when the next integer value of the input integer values is to be encoded. Note that at this time, the right side of the rightmost code tree (code tree with the greatest code tree number) is assumed to be the leftmost code tree (code tree with the smallest code tree number). Note that this rule is merely an example, and any rule may be used as long as it is a rule in which the L code trees are used cyclically. That is, any kind of rule may be used as long as it is a rule in which different code trees are used for the encoding of the next integer value when a rightward triangle is used in each code tree, and as long as it is a code in which the code tree to be used for the encoding of the next integer value when a rightward triangle is used is not redundant for all code trees. However, it is better to use a rule in which a code tree for obtaining a code with a low bit count (T(1) to T(p−1) in the example of FIG. 13) is used first.

A downward triangle indicates a rule in which the code tree T(1) is used when the next integer value of the input integer values is to be encoded. Note that this rule is also merely an example, and any rule may be used as long as it is a rule in which, in the case of a downward triangle, any code tree determined in advance for the downward triangle is set as the code tree to be used in the encoding of the next integer value. For example, it is also possible to use a rule in which, in the case of the downward triangle, the same code tree as the one determined in advance for all of the downward triangles is set as the code tree to be used for the encoding of the next integer value. Also, in order to shorten the average bit count, in the case of a downward triangle, it is preferable to use a rule in which the code tree other than the code tree corresponding to T(0) of FIGS. 11 to 13 is set as the code tree to be used in the encoding of the next integer value, and it is more preferable to use a rule in which a code tree for obtaining a code with a low bit count among the code trees other than the code tree corresponding to T(0) (any of T(1) to T(p−1) in the example of FIG. 13) is set as the code tree to be used in the encoding of the next integer value.

Note that in order to shorten the average bit count the most, it is preferable to use a rule in which, for all code trees, when a downward triangle is used, the code tree to be used in the encoding of the next integer value when a rightward triangle is used in the code tree corresponding to T(0) in FIGS. 11 to 13 is set as the code tree to be used in the encoding of the next integer value.

Although any code tree among the multiple code trees may also be used in the first encoding processing, the rule regarding which code tree is to be used first in the encoding processing is also determined in advance and stored as a rule in which multiple code trees are used. For example, in the case where L=3 is satisfied in FIG. 11, if the integer series $x_1, x_2, \ldots,$ and $x_N$ is to be encoded in order starting from the integer value $x_1$, it is also possible to use a rule in which the integer value $x_1$ is encoded using T(0), it is also possible to use a rule in which the integer value $x_1$ is encoded using T(1), and it is also possible to use a rule in which the integer value $x_1$ is encoded using T(2), but the code tree among T(0) to T(2) that is to be used in the encoding of the integer value $x_1$ is determined and stored in advance.

[[Encoding Processing Using Code Trees]]

The integer encoding unit 110 uses the above-described multiple code trees to encode the integer values included in the input integer series $x_1, x_2, \ldots,$ and $x_N$ in a predetermined order in accordance with the above-described rule in which multiple code trees are used, and obtains a code, and thereafter outputs the obtained code as an integer code. For example, if the predetermined order is the order of sample numbers in the series and the code tree to be used first is $T(0)$, the encoding procedure performed by the integer encoding unit 110 is as follows.

(Encoding Procedure)

1. Set the initial values of the sample number n and the code tree number to 1 and 0 respectively.
2. Repeat (i) to (iv) below until n=N is satisfied.
(i) If the code tree number is 0, obtain the code "1".
(ii) If the integer value $x_n=0$ is satisfied, add 1 to the code tree number and set the result as the new code tree number. At this time, if the code tree number is L after adding 1, set 0 as the new code tree number.
(iii) If the integer value $x_n \neq 0$ is satisfied and the code tree number is less than p, obtain a K-bit code composed of "0", which is one bit, and K−1 bits that are in one-to-one correspondence with the code tree, further obtain a K×($x_n$−1)-bit code "0", and set 1 as the new code tree number.
(iv) If the integer value $x_n \neq 0$ is satisfied and the code tree number is greater than or equal to p, obtain the code of K+1 bits composed of "0", which is one bit, and K bits that are in one-to-one correspondence with the code tree, further obtain a K×($x_n$−1)-bit code "0", and set 1 as the new code tree number.
(v) Add 1 to n and set the result as the new n.
3. Remove the code "1" that was obtained first among the codes obtained in steps 1 and 2.
(Alternatively, do not perform the first instance of operation 2.(i))
4. Add the code "1" (terminating code) to the end of the codes obtained through steps 1 to 3.
5. Output the codes obtained through steps 1 to 4 as the integer code.

Note that, similarly to the first embodiment, it is not essential to perform step 3 of the encoding procedure.

Also, similarly to the first embodiment, depending on how the integer code is transmitted from the encoding apparatus 100 to the decoding apparatus 150, step 4 of the encoding procedure need not be performed.

Note that the code "0" in the description above is an example of any one bit value among binary bit values, and the code "1" in the description above is an example of another bit value among binary bit values. That is, obviously, the code "1" may also be used instead of the code "0" in the description above, and the code "0" may also be used instead of the code "1".

<<Decoding Apparatus>>

A processing procedure for a decoding method executed by the decoding apparatus 150 of the third embodiment will be described with reference to FIGS. 7 and 8. As shown in FIG. 7, the decoding apparatus 150 of the third embodiment includes an integer decoding unit 160. The decoding method of the third embodiment is realized due to the decoding apparatus 150 of the third embodiment executing the processing of the steps shown in FIG. 8.

The integer code output by the encoding apparatus 100 of the third embodiment is input to the decoding apparatus 150 of the third embodiment. The decoding apparatus 150 of the third embodiment restores the series of non-negative integer values input to the encoding apparatus 100 of the third embodiment by decoding the input integer code using decoding processing performed using the predetermined multiple code trees corresponding to the encoding apparatus 100 of the third embodiment according to a pre-determined rule corresponding to the encoding apparatus 100 of the third embodiment and obtaining a series of non-negative integer values. Hereinafter, similarly to the description of the above-described encoding apparatus 100, the non-negative integer values will be referred to simply as "integer values" in the description.

[Integer Decoding Unit 160]

The integer code input to the decoding apparatus 150 is input to the integer decoding unit 160. Based on the encoding parameter L, which is a value that is the same as the encoding parameter L used by the integer encoding unit 110 of the encoding apparatus 100 and is a natural number greater than or equal to 2 that is stored in advance in the integer decoding unit 160 or input through a means not shown in the drawings, the integer decoding unit 160 decodes the input integer code through decoding processing performed using the following code trees to obtain a series of integer values, and outputs the obtained integer series $x_1, x_2, \ldots,$ and $x_N$ (S160). Hereinafter, description will be given assuming that each integer of the integer series $x_1, x_2, \ldots, x_N$ is $x_n$ (n being a sample number in a series; $n \in \{1, 2, \ldots, N\}$).

Also, hereinafter, description will be given using K, which is the smallest natural number at which $2^K$ is greater than L, p, which is a natural number obtained by subtracting L from $2^K$, and q, which is a natural number obtained by subtracting $2^{K-1}$ from L. Although K, p, and q are values that can be expressed using L and are used for convenience in order to simplify the description, they may also be used by the integer decoding unit 160 in actuality. If the integer decoding unit 160 is to use K, p, or q, the integer decoding unit 160 may also obtain the values of K, p, and q by performing calculation using the encoding parameter L, the values of K, p, and q may also be input together with the encoding parameter L through a means not shown in the drawings, and if the encoding parameter L is stored in advance in the integer decoding unit 160, the values of K, p, and q may also be stored in advance in the integer decoding unit 160.

The code trees used in the decoding processing are the same as the code trees used by the integer encoding unit 110 of the encoding apparatus 100 of the third embodiment, and L code trees illustrated in FIGS. 11 to 13 are stored in advance in the integer decoding unit 160. The rule in which the relationship between the input code and the integer value corresponding to the code in the code tree in the decoding processing and multiple code trees are used corresponds to the rule used in the encoding processing of the integer encoding unit 110 of the encoding apparatus 100 of the third embodiment, is a rule obtained by replacing "code allocated to the input integer value" with "input code" and replacing "input integer value" with "integer value allocated to the input code" in the rule used in the encoding processing of the integer encoding unit 110 of the encoding apparatus 100 of the third embodiment, and the rule is stored in advance in the integer decoding unit 160. Note that the rule regarding which code tree is to be used first in the decoding processing is also the same as the rule used by the integer encoding unit 110 of the encoding apparatus 100 of the third embodiment, and is stored in advance in the integer decoding unit 160.

The integer decoding unit 160 uses the above-described multiple code trees to obtain a string of integer values corresponding to the input integer code according to the above-described rule in which the multiple code trees are used, organizes the integers of the obtained string of integer values into a predetermined order to obtain and output the integer series $x_1, x_2, \ldots,$ and $x_N$. For example, the decoding procedure performed by the integer decoding unit 160 in the case where the predetermined order is the sample number order in the series and the code tree that is used first is T(0), is as indicated by the decoding procedure 1 or the decoding procedure 2 below.

(Decoding procedure 1-1) In the case where addition of an terminating code through encoding procedure 4 has not been performed, that is, if the decoding apparatus 150 can specify the end of the integer code
1. If the code "1" has been removed in step 3 of the encoding procedure, the code "1" is added to the beginning of the integer code.
2. Set the initial value of the code tree number to 0.
3. Repeat (i) and (ii) below until there is no integer code that has not been read, and when there is no integer code that has not been read, proceed to step 4.
(i) Read the input integer code in order while there is a code that corresponds to the read code in the code tree corresponding to the code tree number (i.e., until one bit before the code corresponding to the read code in the code tree corresponding to the code tree number ends).
(ii) Obtain the integer value corresponding to the code corresponding to the read code from the code tree corresponding to the code tree number, and obtain a new code tree number according to the code tree transition rule for the integer value of the code tree.
4. Output the series of integer values obtained in (ii) of step 3 as the integer series $x_1, x_2, \ldots,$ and $x_N$.

(Decoding procedure 1-2) In the case where addition of the terminating code through step 4 of the encoding procedure has been performed, that is, if the decoding apparatus 150 cannot specify the end of the integer code
1. If the code "1" has been removed in step 3 of the encoding procedure, add the code "1" to the beginning of the input code string (code string including the integer code and another subsequent code).
2. Set the initial values of the sample number n and the code tree number to 1 and 0 respectively.
3. Repeat (i) and (ii) below until n=N is satisfied.
(i) Read the input code string in order while there is a code corresponding to the read code in the code tree corresponding to the code tree number (i.e., until one bit before the code corresponding to the read code in the code tree corresponding to the code tree number ends).
(ii) Obtain the integer value corresponding to the code corresponding to the read code from the code tree corresponding to the code tree number, obtain a new code tree number according to the code tree transition rule for the integer value of the code tree, and set the result of adding 1 to n as the new n.
4. Output the series of integer values obtained in (ii) of step 3 as the integer series $x_1, x_2, \ldots,$ and $x_N$.
(Decoding Procedure 2)
1. If addition of the terminating code has not been performed in step 4 of the encoding procedure, add the terminating code "1" to the end of the input code string. Also, if the code "1" was not removed in step 3 of the encoding procedure, remove the code "1" from the beginning of the input code string.
2. Set the initial values of the sample number n and the code tree number to 1 and 0 respectively.
3. Repeat (i) to (v) below until n≥N is satisfied.

(i) Read K bits'-worth of the input code string in order while all of the K bits are the code "0", and set a value obtained by dividing the number of codes "0" read in that period by K to Z.
(ii) If the code tree number is 0, obtain the integer value Z.
(iii) if the code tree number is not 0, obtain the integer value (Z+1).
(iv) If the next bit of the input code string is the code "1", read that bit, obtain the (L−1) integer values 0, set 0 as the new code tree number, and set the result of adding L to n as the new n.
(v) If the next bit of the input code string is the code "0", read K bits including that bit, and if there is a code tree that is in one-to-one correspondence with the remaining K−1 bits from which the first bit of the K bits has been removed, set the number of the code tree corresponding to the K−1 bits as the new code tree number, and if there is no code tree that is in one-to-one correspondence with the remaining K−1 bits from which the first bit of the K bits has been removed (i.e., if the K−1 bits are in one-to-one correspondence with a set composed of two code trees), read the next bit, set the number of the code tree in one-to-one correspondence with the K bits composed of the remaining K−1 bits from which the first bit of the above-described K bits has been removed and the read bit as the new code tree number, obtain the (new code tree number−1) integer values 0 in each case, and set the result of adding the new code tree number to n as the new n.
4. If the number of obtained integer values is greater than N, remove the (N+1)-th integer value and onward.

According to the embodiment of the present invention, it is possible to perform encoding with a low average bit count even for a series of integer values that is significantly biased to small values including small values that are not zero values, or a series of integer values with values that are biased such that it cannot be completely handled using the technique of NPL 2. Also, this kind of code can be decoded.

Description of Principle of Invention of Third Embodiment

Here, the principle of the present invention will be described.

According to the encoding apparatus 100 of the third embodiment, it is possible to allocate codes to all non-negative integer values and the non-negative integer values can be restored due to the decoding apparatus 150 of the third embodiment decoding the code. As shown in FIGS. 11 to 13, the maximum number of consecutive integer values 0 that can be expressed is L, which is not limited to an integer power of 2. Due to this fact, K is not limited to an integer value as with the codes of the first embodiment and the second embodiment, and the code of the present invention used in the third embodiment is a code that provides the approximately optimal expected bit length to a series of non-negative integer values that follow an exponential distribution (one-sided Laplace distribution) with a large bias shown in Expression (3) for all Ks for which $2^{K-1}$ is a natural number L, and is a code according to which the average bit count for the series of non-negative integer values that is significantly biased toward a small value according to a distribution in which K is not an integer value can be made smaller than with the codes of the first embodiment and the second embodiment.

Note that the above-described Expression (3) can be approximated as the following Expression (4a) using the maximum number $2^{K-1}$ of consecutive integer values 0 in the code of the first embodiment and the second embodiment.

[Formula 4]

$$p(x, 1-2^{-1/2K-1}) = 2^{-1/2K-1} \cdot (1-2^{-1/2K-1})^x \quad (4a)$$

Accordingly, the maximum number of consecutive integer values 0 that can be expressed using the code influences the distribution of inputs for which the compression efficiency is at its maximum. Here, the code of the present invention used in the third embodiment using the encoding parameter L is a code that provides an approximately optimal expected bit length to the series of non-negative integer values that follows the distribution of Expression (4b) below.

[Formula 5]

$$p(x, 1-2^{-1/L}) = 2^{-1/L} \cdot (1-2^{-1/L})^x \quad (4b)$$

That is, similarly to the encoding parameters K of the first embodiment and the second embodiment, the encoding parameter L of the present invention can be interpreted as a Golomb parameter that is expanded to values greater than zero and less than 1, or a Rice parameter that is expanded to negative values, and furthermore, corresponds to a parameter that expands the possible values of the encoding parameter K of the first embodiment and the second embodiment such that the maximum number of consecutive integer values 0 may be any value. Accordingly, this means that the optimal parameter L in the code of the present invention allocated to the series of non-negative values can be estimated by performing estimation of the Golomb parameter or Rice parameter that is optimal for the series of non-negative integer values.

Fourth Embodiment

In the third embodiment, a mode was described in which the encoding and decoding of the present invention is realized using predetermined code trees, but encoding and decoding equivalent to that of the third embodiment can be realized also by using predetermined correspondence tables instead of the predetermined code tree. The mode in which the predetermined correspondence tables are used will be described as a fourth embodiment.

<<Encoding Apparatus>>

A processing procedure of an encoding method executed by an encoding apparatus 100 of a fourth embodiment will be described with reference to FIGS. 2 and 3. As shown in FIG. 2, the encoding apparatus 100 of the fourth embodiment includes an integer encoding unit 110. The encoding method of the fourth embodiment is realized due to the encoding apparatus 100 of the fourth embodiment executing the processing of the steps shown in FIG. 3.

Similarly to the first to third embodiments, a series of non-negative integer values are input to the encoding apparatus 100 of the fourth embodiment. The encoding apparatus 100 of the fourth embodiment follows pre-determined correspondence tables to perform variable-length encoding of a series of non-negative integer values, thereby realizing encoding processing in which a shorter bit length than in Golomb encoding and Golomb-Rice encoding is achieved for a series of non-negative integer values of a distribution with a more significant bias than an exponential distribution envisioned by Golomb encoding and Golomb-Rice encoding. Hereinafter, non-negative integer values input to the encoding apparatus 100 will be called "integer values" in the description.

[Integer Encoding Unit 110]

An integer series $x_1, x_2, \ldots, x_N$ of N samples among a series of integer values input to the encoding apparatus 100 is input to the integer encoding unit 110. The integer encoding unit 110 of the fourth embodiment encodes the input integer series $x_1, x_2, \ldots, x_N$ based on correspondence tables that were created in advance corresponding to the encoding parameter L, which is a natural number greater than or equal to 2, and were stored in the integer encoding unit 110, obtains a code, and outputs the obtained code as the integer code (S110).

[[Correspondence Tables Used in Encoding Processing]]

The correspondence tables stored in advance are obtained by storing a rule of a correspondence relationship between a partial series of integer values composed of a combination of consecutive zero values (0 or more consecutive values) and one non-zero value, and a code corresponding to the partial series. Examples of correspondence tables in which L=3 and L=5 are satisfied are shown in FIGS. 14 and 15. The rule stored in the correspondence tables is a rule in which a one-bit code with a bit value of "1" is allocated to a partial series composed of L consecutive zero values, and a $K \times x_n$-bit or $K \times x_n+1$-bit code in which, with respect to each combination of consecutive zero values and a non-zero value $x_n$, at least the bit value "1" and at least the bit value "0" is included in the first bit to the K-th bit and the bit values of the $K \times (x_n-1)$ bits from the end are "0" is allocated to the other partial series, that is, the partial series composed of 0 to L−1 consecutive zero values and one non-zero value $x_n$ subsequent thereto.

More specifically, in this rule, codes including the L partial codes of (a) to (c) below, which are in one-to-one correspondence with the L numbers of consecutive 0 to L−1 zero values, are allocated to each of the partial series composed of 0 to L−1 consecutive zero values and one non-zero value.

(a) One partial code, which is constituted by K+1 bits from a first bit to a (K+1)-th bit of a $K \times x_n+1$-bit code, and in which the bit value of the first bit is "1" and the bit values of the second bit to the (K+1)-th bit are "0".

(b) p−1 (i.e., $2^K-L-1$) partial codes, which are constituted by K bits from a first bit to a K-th bit of a $K \times x_n$-bit code, and in which the bit value of the first bit is "0" and the bit value of at least one bit among the K−1 bits from the second bit to the K-th bit is "1".

(c) 2q (i.e., $2L-2^K$) partial codes, which are constituted by K+1 bits from a first bit to a (K+1)-th bit of the $K \times x_n+1$-bit code, and in which the bit value of the first bit is "0", the bit value of at least one bit among the K−1 bits from the second bit to the K-th bit is "1", the set of K bits from the first bit to the K-th bit is different from the p−1 (i.e., $2^K-L-1$) partial codes of (b) above, and the bit value of the (K+1)-th bit is "1" or "0".

[[Encoding Processing Using Correspondence Tables]]

The integer encoding unit 110 uses the above-described correspondence tables to encode the integer values included in the input integer series $x_1, x_2, \ldots,$ and $x_N$ in a predetermined order and obtain a code, and outputs the obtained code as the integer code. For example, an encoding procedure performed by the integer encoding unit 110 in the case where the predetermined order is a sample number order in the series is as described below.

(Encoding Procedure)

1. The sample number n is set to 1.

2. Repeat (i) and (ii) below until n=N is satisfied.

(i) If there is a non-zero value among the L integer values of $x_n$ and onward, obtain a code corresponding to the partial series up to the first non-zero value of $x_n$ and onward from a code table, and set the result of adding n to the sample count up to the first non-zero value of $x_n$ and onward as the new n.

(ii) If all of the L integer values of $x_n$ and onward are zero values, obtain the code corresponding to the partial series of the L integer values of $x_n$ and onward from the code table, and set the result of adding L to n as the new n.

3. Add the code "1" (terminating code) to the end of the code obtained through step 2.

4. Output the code obtained through step 3 as the integer code.

Note that, similarly to the third embodiment, depending on how the integer code is transmitted from the encoding apparatus 100 to the decoding apparatus 150, the processing for adding the terminating code (step 3 of the encoding procedure) need not be performed.

Note that the codes obtained through the encoding processing using FIGS. 14 and 15 in the integer encoding unit 110 of the encoding apparatus 100 of the fourth embodiment match the codes obtained in the case where the code tree that is to be used first is T(1) in the encoding processing using the code trees of FIGS. 11(B) and 12(B) in the integer encoding unit 110 of the encoding apparatus 100 of the third embodiment. Also, when the integer encoding unit 110 of the encoding apparatus 100 of the fourth embodiment performs encoding using FIGS. 14 and 15, the integer encoding unit 110 performs encoding after adding (L−1) zero values to the front of the input integer series $x_1, x_2, \ldots,$ and $x_N$, and if the code "1" at the front of the obtained integer code is removed, the code matches the code obtained in the case where the code tree that is to be used first is T(0) in the encoding processing using the code trees of FIGS. 11(B) and 12(B) in the integer encoding unit 110 of the encoding apparatus 100 of the third embodiment. In this manner, the encoding processing using the correspondence tables in the integer encoding unit 110 of the encoding apparatus 100 of the fourth embodiment is equivalent to the encoding processing using the code trees in the integer encoding unit 110 of the encoding apparatus 100 of the third embodiment.

<<Decoding Apparatus>>

A processing procedure for a decoding method executed by the decoding apparatus 150 of the fourth embodiment will be described with reference to FIGS. 7 and 8. As shown in FIG. 7, the decoding apparatus 150 of the fourth embodiment includes an integer decoding unit 160. The decoding method of the fourth embodiment is realized due to the decoding apparatus 150 of the fourth embodiment executing the processing of the steps shown in FIG. 8.

Similarly to the decoding apparatus 150 of the third embodiment, the integer code output by the encoding apparatus 100 of the fourth embodiment is input to the decoding apparatus 150 of the fourth embodiment. The decoding apparatus 150 of the fourth embodiment restores the series of non-negative integer values input to the encoding apparatus 100 of the fourth embodiment by decoding the input integer code through encoding processing using correspondence tables that are the same as the correspondence tables stored in the integer encoding unit 110 of the encoding apparatus 100 of the fourth embodiment and obtaining a series of non-negative integer values. Hereinafter, similarly to the description of the above-described encoding apparatus, the non-negative integer values will be referred to simply as "integer values" in the description.

[Integer Decoding Unit 160]

The integer code input to the decoding apparatus 150 is input to the integer decoding unit 160. Based on correspondence tables that are created in advance and stored in the integer decoding unit 160, the correspondence tables being pre-created correspondence tables that correspond to an encoding parameter L and are the same as the correspondence tables that were stored in advance in the integer encoding unit 110 of the encoding apparatus 100 and were used by the integer encoding unit 110, the integer decoding unit 160 decodes the input integer code and obtains and outputs the integer series $x_1, x_2, \ldots,$ and $x_N$ (S160).

More specifically, the integer decoding unit 160 outputs, as the integer series $x_1, x_2, \ldots,$ and $x_N$, a series composed of partial series of integers obtained by repeatedly performing, from the beginning to the end of the input integer code, processing for reading code portions that have not yet been read in the input integer code from the beginning to the portion that includes a code corresponding to the correspondence tables and obtaining a partial series of integers corresponding to the read codes from the correspondence table. Through this decoding processing, it is possible to obtain an integer series $x_1, x_2, \ldots,$ and $x_N$ that is the same as that in the case where the code tree that is to be used first is T(1) in the decoding processing using the code trees of FIGS. 11(B) and 12(B) in the integer decoding unit 160 of the decoding apparatus 150 of the third embodiment.

Note that if the integer encoding unit 110 of the encoding apparatus 100 performs encoding after adding (L−1) zero values to the front of the input integer series $x_1, x_2, \ldots,$ and $x_N$ and processing for removing the code "1" at the front of the obtained integer code has been performed, the integer decoding unit 160 need only obtain the partial series through the above-described decoding processing based on the above-described correspondence tables after adding the code "1" to the front of the input integer code, omit the (L−1) zero values obtained first, and thereafter output the integer series $x_1, x_2, \ldots,$ and $x_N$ composed of the partial series. Through this decoding processing, it is possible to obtain an integer series $x_1, x_2, \ldots,$ and $x_N$ that is the same as that in the case where the code tree that is to be used first is T(0) in the decoding processing using the code trees of FIGS. 11(B) and 12(B) in the integer decoding unit 160 of the decoding apparatus 150 of the third embodiment. In this manner, the decoding processing using the correspondence tables in the integer decoding unit 160 of the decoding apparatus 150 of the fourth embodiment is equivalent to the decoding processing using the code trees in the integer decoding unit 160 of the decoding apparatus 150 of the third embodiment.

As can be understood from the description above, the integer code obtained by the encoding apparatus 100 of the third embodiment through the encoding processing using the code trees may also be decoded by the decoding apparatus 150 of the fourth embodiment through decoding processing using a correspondence tables corresponding to the encoding processing to obtain the integer series $x_1, x_2, \ldots,$ and $x_N$ and, also, the integer code obtained by the encoding apparatus 100 of the fourth embodiment through encoding processing using the correspondence tables may also be decoded by the decoding apparatus 150 of the third embodiment through decoding processing using code trees corresponding to the encoding processing to obtain the integer series $x_1, x_2, \ldots,$ and $x_N$.

According to the embodiment of the present invention, it is possible to perform encoding with a low average bit count even for a series of integer values that are significantly biased at small values including small values that are not zero values, or a series of integer values with values that are biased such it cannot be completely handled using the technique of NPL 2. Also, this kind of code can be decoded.

Fifth Embodiment

In the third embodiment and the fourth embodiment, a mode was described in which encoding and decoding of the present invention is realized based on a procedural aspect in which encoding and decoding are performed using predetermined code trees or a predetermined correspondence table. In a fifth embodiment, a mode will be described in which encoding and decoding of the present invention are realized based on a data-wise aspect of the codes and the series of integer values obtained through these procedures.

In the description of the present embodiment, L is an integer that is greater than or equal to 2. Also, K is the smallest natural number for which $2^K$ is greater than L, p is a natural number obtained by subtracting L from $2^K$, and q is a natural number obtained by subtracting $2^{K-1}$ from L. Furthermore, it is assumed that the bit value "x" is the bit value "1" and the bit value "y" is the bit value "0", or the bit value "x" is the bit value "0" and the bit value "y" is the bit value "1".

<<Encoding Apparatus>>

A processing procedure of an encoding method executed by an encoding apparatus 100 of the fifth embodiment will be described with reference to FIGS. 2 and 3. As shown in FIG. 2, the encoding apparatus 100 of the fifth embodiment includes an integer encoding unit 110. The encoding method of the fifth embodiment is realized due to the encoding apparatus 100 of the fifth embodiment executing the processing of the steps shown in FIG. 3.

A series of non-negative integer values $x_n$, $n \in \{1, 2, \ldots, N\}$ (hereinafter referred to as "integer series") is input to the encoding apparatus 100 of the fifth embodiment. Hereinafter, non-negative integer values input to the encoding apparatus 100 will be called "integer values" in the description.

[Integer Encoding Unit 110]

The integer encoding unit 110 obtains a 1-bit code (hereinafter referred to as "code A") with a bit value of "x" as the code corresponding to the L consecutive integer values 0 included in the integer series, and obtains a K×$x_n$-bit or K×$x_n$+1-bit code (hereinafter referred to as "code B") that includes at least one bit value "x" and at least one bit value "y" in the first bit to the K-th bit and in which the bit value of the K×($x_n$−1) bits from the end are "y" as the code corresponding to the set composed of 0 to L−1 integer values 0 and one integer value $x_n$ other than 0, the set being included in the integer series (S110). Specifically, the integer series $x_1, x_2, \ldots,$ and $x_N$ of N samples is encoded using the code trees described in the third embodiment or the correspondence tables described in the fourth embodiment to obtain the code A and the code B.

Note that regarding the code B, there is a one-to-one correspondence relationship between the L numbers of 0 to L−1 consecutive integer values 0 in the integer series and the following L partial codes.

(Partial Codes of Code B)

(a) One partial code, which is constituted by K+1 bits from a first bit to a (K+1)-th bit of the code B when the code B is K×$x_n$+1 bits, and in which the bit value of the first bit is "x" and the bit values of the second bit to the (K+1)-th bit are "y".

(b) p−1 (i.e., $2^K$−L−1) partial codes, which are constituted by K bits from the first bit to the K-th bit of the code B when the code B is K×$x_n$ bits, and in which the bit value of the first bit is "y" and the bit value of at least one bit among the K−1 bits from the second bit to the K-th bit is "x".

(c) 2q (i.e., 2L−$2^K$) partial codes, which are constituted by K+1 bits from a first bit to a (K+1)-th bit of the code B when the code B is K×$x_n$+1, and in which the bit value of the first bit is "y", the bit value of at least one bit among the K−1 bits from the second bit to the K-th bit is "x", the set of K bits from the first bit to the K-th bit is different from the p−1 (i.e., $2^K$−L−1) partial codes of (b) above, and the bit value of the (K+1)-th bit is "x" or "y".

<<Decoding Apparatus>>

A processing procedure for a decoding method executed by the decoding apparatus 150 of the fifth embodiment will be described with reference to FIGS. 7 and 8. As shown in FIG. 7, the decoding apparatus 150 of the fifth embodiment includes an integer decoding unit 160. The decoding method of the fifth embodiment is realized due to the decoding apparatus 150 of the fifth embodiment executing the processing of the steps shown in FIG. 8.

The code string output by the encoding apparatus 100 of the fifth embodiment is input to the decoding apparatus 150 of the fifth embodiment. Hereinafter, similarly to the description of the above-described encoding apparatus, the non-negative integer values will be referred to simply as "integer values" in the description.

[Integer Decoding Unit 160]

The integer decoding unit 160 obtains L consecutive integer values 0 from the 1-bit code having a bit value of "x" (hereinafter referred to as "code A"), which is included in the input code string, and obtains the 0 to L−1 consecutive integer values 0 and the one integer value $x_n$ other than 0 from the K×$x_n$-bit or K×$x_n$+1-bit code (hereinafter referred to as "code B"), which includes at least one bit value "x" and at least one bit value "y" in the first bit to the K-th bit included in the input code string, and in which the bit values of the K×($x_n$−1) bits from the end are "y" (S160). Specifically, the code included in the input code string is decoded using the code trees described in the third embodiment or the correspondence tables described in the fourth embodiment to obtain the above-described series of integer values corresponding to the code A and the code B.

For example, the integer decoding unit 160 specifies the code A and the code B included in the input code string by performing the following two steps of processing. The two steps of processing are a step in which the integer decoding unit 160 reads K consecutive bits (hereinafter referred to as "K-bit string") of the input code string in order starting from the beginning of the input code string, and a step in which, when the read K-bit string includes "y", the integer decoding unit 160 identifies that the immediately-previous bit of the K-bit string including "y" is the code A or the final bit of the code B.

Note that in the code B, there is a one-to-one correspondence relationship between the following L partial codes and the L numbers of 0 to L−1 consecutive integer values 0 in the series composed of the integer values obtained by the integer decoding unit 160.

(Partial Codes of Code B)

(a) One partial code, which is constituted by K+1 bits from a first bit to a (K+1)-th bit of the code B when the code B is K×$x_n$+1 bits, and in which the bit value of the first bit is "x" and the bit values of the second bit to the (K+1)-th bit are "y".

(b) p−1 (i.e., $2^K$−L−1) partial codes, which are constituted by K bits from a first bit to a K-th bit of the code B when the code B is K×$x_n$ bits, and in which the bit value of the first bit is "y", and the bit value of at least one bit among the K−1 bits from the second bit to the K-th bit is "x".

(c) 2q (i.e., 2L−2$^1$) partial codes, which are constituted by K+1 bits from the first bit to the (K+1)-th bit of the code B when the code B is K×x$_n$+1 bits, and in which the bit value of the first bit is "y", the bit value of at least one bit among the K−1 bits from the second bit to the K-th bit is "x", the set of K bits from the first bit to the K-th bit is different from the p−1 (i.e., 2$^K$−L−1) partial codes of (b) above, and the bit value of the (K+1)-th bit is "x" or "y".

<<Data Structure of Code String>>

A data structure of a code string handled by the encoding apparatus and the decoding apparatus of the fifth embodiment, that is, the data structure of the code string that is obtained based on the series of integer values by the encoding apparatuses of the third embodiment and the fourth embodiment, and is to be used for the decoding apparatuses of the third embodiment and the fourth embodiment to obtain the series of integer values will be described hereinafter.

[Data Structure of Code String]

A code string indicating a series of integer values $x_n$ that are non-negative values, n∈{1, 2, . . . , N} (hereinafter referred to as "integer series") is to be used by an encoding apparatus that obtains a code string from an integer series or a decoding apparatus that obtains an integer series from the code string.

The data structure of the code string includes a one-bit code (hereinafter referred to as "code A") having a bit value of "x" as a code corresponding to L consecutive integer values 0 included in the integer series, and a K×x$_n$-bit or K×x$_n$+1-bit code (hereinafter referred to as "code B"), which includes at least one bit value "x" and at least one bit value "y" in the first bit to the K-th bit, and in which the bit values of the K×(x$_n$−1) bits from the end are "y", as the code corresponding to the set composed of 0 to L−1 consecutive integer values 0 and one integer value x$_n$ other than 0 included in the integer series.

Note that regarding the code B, there is a one-to-one correspondence relationship between the L numbers of 0 to L−1 integer values 0 in the integer series and the following L partial codes.

(Partial Codes of Code B)

(a) One partial code, which is constituted by K+1 bits from a first bit to a (K+1)-th bit of the code B when the code B is K×x$_n$+1 bits, and in which the bit value of the first bit is "x" and the bit values of the second bit to the (K+1)-th bit are "y".

(b) p−1 (i.e., 2$^K$−L−1) partial codes, which are constituted by K bits from the first bit to the K-th bit of the code B when the code B is K×x$_n$ bits, and in which the bit value of the first bit is "y", and the bit value of at least one bit among the K−1 bits from the second bit to the K-th bit is "x".

(c) 2q (i.e., 2L−2$^K$) partial codes, which are constituted by K+1 bits from a first bit to a (K+1)-th bit of the code B when the code B is K×x$_n$+1 bits, and in which the bit value of the first bit is "y", the bit value of at least one bit among the K−1 bits from the second bit to the K-th bit is "x", the set of K bits from the first bit to the K-th bit is different from the p−1 (i.e., 2$^K$−L−1) partial codes of (b) above, and the bit value of the (K+1)-th bit is "x" or "y".

According to the embodiment of the present invention, it is possible to perform encoding with a low average bit count even for a series of integer values that are significantly biased at small values including small values that are not zero values, or a series of integer values with values that are biased such that it cannot be completely handled using the technique of NPL 2. Also, this kind of code can be decoded.

Sixth Embodiment

As described above, the encoding parameter L used in the code of the present invention corresponds to a Golomb parameter expanded to values greater than 0 and less than 1 or a Rice parameter expanded to negative values, and the code of the present invention can be interpreted also as a Golomb code for a Golomb parameter expanded to values greater than 0 and less than 1, or a Golomb-Rice code for a negative-value Rice parameter. Accordingly, the optimal encoding parameter L may also be obtained for a partial series of a series composed of input integer values based on a conventional optimal Golomb parameter estimation method, and the series of input integer values may be encoded using the processing of the integer encoding units of the third to fifth embodiments using the obtained encoding parameter L, in combination with Golomb encoding, and decoding corresponding to this encoding may also be performed. This mode will be described as a sixth embodiment.

<<Encoding Apparatus>>

Figure 16:
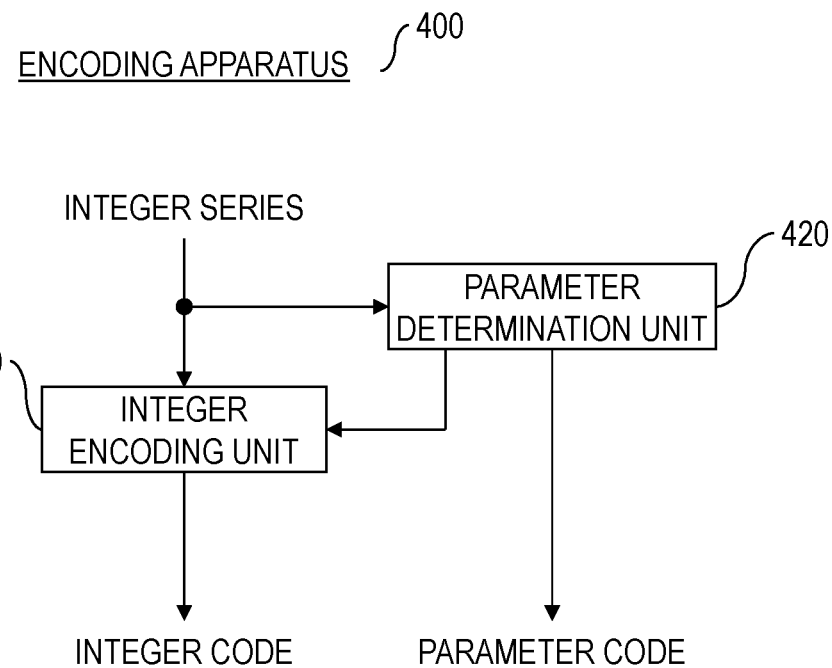
FIG. 16 is a block diagram showing an example of a configuration of an encoding apparatus 400.
Figure 17:
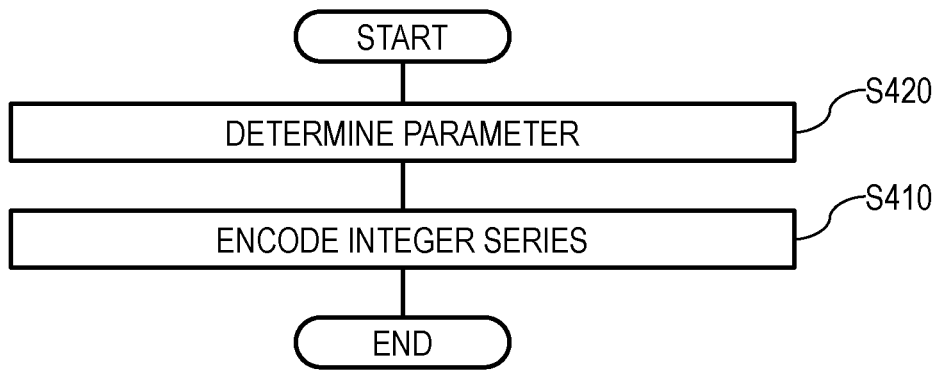
FIG. 17 is a flowchart showing an example of operations of the encoding apparatus 400.

A processing procedure of an encoding method executed by the encoding apparatus 400 of the sixth embodiment will be described with reference to FIGS. 16 and 17. As shown in FIG. 16, the encoding apparatus 400 of the sixth embodiment includes a parameter determination unit 420 and an integer encoding unit 410. The encoding method of the sixth embodiment is realized due to the encoding apparatus 400 of the sixth embodiment executing the processing of the steps shown in FIG. 17.

Similarly to the third to fifth embodiments, a series of non-negative integer values are input to the encoding apparatus 400 of the sixth embodiment. N samples of the series of non-negative integer values input to the encoding apparatus 400 of the sixth embodiment are input to the parameter determination unit 420 and the integer encoding unit 410. That is, the encoding apparatus 400 of the sixth embodiment encodes, in units of frames composed of N samples, the series of integer values, such as a series composed of absolute values of integer values obtained by, for example, converting audio, music, or the like collected by a microphone into a digital signal and performing quantization.

Hereinafter, a non-negative integer value input to the encoding apparatus of the present embodiment will be referred to simply as an "integer value" in the description.

[Parameter Determination Unit 420]

An integer series $x_1, x_2, \ldots, x_N$ of N samples among a series of integer values input to the encoding apparatus 400 is input to the parameter determination unit 420. Based on the input integer series $x_1, x_2, \ldots,$ and $x_N$, the parameter determination unit 420 obtains and outputs a Golomb parameter s that corresponds to the integer series and a parameter code, which is a code indicating the parameter (S420). The parameter code need only be obtained by encoding the Golomb parameter such that the Golomb parameter s determined by the parameter determination unit 420 can be obtained by the decoding apparatus 450 decoding the parameter code.

The parameter determination unit 420 obtains a Golomb parameter s through Expression (5) using, for example, the integer values included in the input integer series $x_1, x_2, \ldots,$ and $x_N$.

[Formula 6]

$$s = \frac{\ln 2}{N} \sum_{n=1}^{N} x_n \quad (5)$$

The Golomb parameter s obtained using Expression (5) minimizes the estimated value of the total bit length during Golomb encoding, which is estimated using Expression (2) for the integer series $x_1, x_2, \ldots,$ and $x_N$.

Also, for example, the parameter determination unit 420 obtains a code by subjecting the Golomb parameter s obtained using Expression (5) to scalar quantization, outputs the obtained code as a parameter code, and outputs the quantized value of the Golomb parameter s corresponding to the parameter code as the Golomb parameter s.

[Integer Encoding Unit 410]

The N samples of the integer series $x_1, x_2, \ldots,$ and $x_N$ of the series of integer values input to the encoding apparatus 400 and the Golomb parameter s output by the parameter determination unit 420 are input to the integer encoding unit 410. If the Golomb parameter s is 1 or more, the integer encoding unit 410 rounds the Golomb parameter s to an integer value by rounding off the first decimal of the Golomb parameter s or the like, thereafter performs Golomb encoding using the Golomb parameter s of the integer value on the integer series $x_1, x_2, \ldots,$ and $x_N$, and outputs the code obtained through Golomb encoding as an integer code, and if the Golomb parameter s is less than 1, the integer encoding unit 410 obtains the value of L based on the Golomb parameter s through later-described processing, rounds the value of L to an integer value by rounding off the first decimal of the obtained value of L or the like, and thereby obtains the encoding parameter L, and obtains and outputs an integer code using the obtained encoding parameter L through processing that is the same as any processing performed by the integer encoding units 110 of the third to fifth embodiments (S410). Note that if the encoding parameter L is a value between 1 and 2, for example, the rounded integer value may be set to 2.

The processing for obtaining the value of L from the Golomb parameter s is performed by obtaining the value of L at which the exponential distribution $p(x, 2^{-1/s})$ expressed using s and the exponential distribution $p(x, 1-2^{-1/L})$ expressed using L are the same, or by obtaining a value of L at which the exponential distribution $p(x, 2^{-1/s})$ expressed using s can be approximated with the exponential distribution $p(x, 1-2^{-1/L})$ expressed using L. That is, the value of L is obtained based on the Golomb parameter s so as to obtain a relationship in which the exponential distribution $p(x, 2^{-1/s})$ expressed using s and the exponential distribution $p(x, 1-2^{-1/L})$ expressed using L are the same or similar. For example, the value of L is obtained from the Golomb parameter s using Expression (6a), which is a formula for converting s to L, which is directly derived from $p(x, 2^{-1/s}) = p(x, 1-2^{-1/L})$.

[Formula 7]

$$L = -(\log_2(1-2^{-1/s}))^{-1} \quad (6a)$$

For example, the value of L may also be obtained using Expression (6b), which is obtained by approximating Expression (6a) above, as the value of L at which the exponential distribution $p(x, 2^{-1/s})$ expressed using s is approximated with the exponential distribution $p(x, 1-2^{-1/L})$ expressed using L.

[Formula 8]

$$L = 2^{1/s-1} \quad (6b)$$

<<Decoding Apparatus>>

Figure 18:
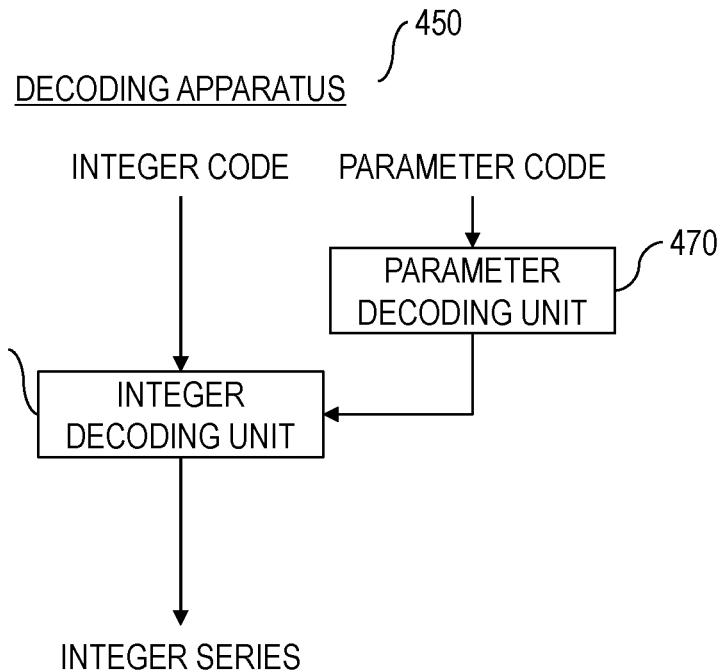
FIG. 18 is a block diagram showing an example of a configuration of a decoding apparatus 450.
Figure 19:
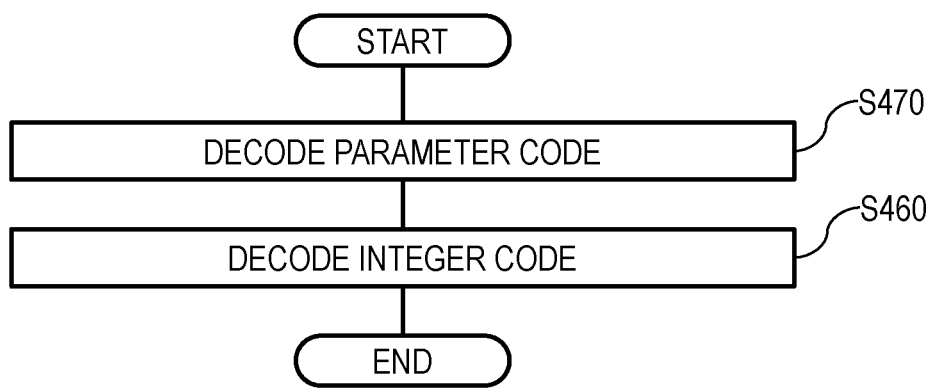
FIG. 19 is a flowchart showing an example of operations of the decoding apparatus 450.

A processing procedure of a decoding method executed by a decoding apparatus 450 of the sixth embodiment will be described with reference to FIGS. 18 and 19. As shown in FIG. 18, the decoding apparatus 450 of the sixth embodiment includes a parameter decoding unit 470 and an integer decoding unit 460. The decoding method of the sixth embodiment is realized due to the decoding apparatus 450 of the sixth embodiment executing the processing of the steps shown in FIG. 19.

The integer code and the parameter code output by the encoding apparatus 400 of the sixth embodiment are input to the decoding apparatus 450 of the sixth embodiment. The integer code and the parameter code input to the decoding apparatus 450 are input to the parameter decoding unit 470 and the integer decoding unit 460 for each code corresponding to N samples of the series of integer values. That is, the decoding apparatus 450 performs decoding processing on each frame that is the same as in the encoding apparatus 400.

[Parameter Decoding Unit 470]

The parameter code input to the decoding apparatus 450 is input to the parameter decoding unit 470. The parameter decoding unit 470 decodes the parameter code using decoding processing corresponding to the processing used by the parameter determination unit 420 to obtain the parameter code, and obtains and outputs the Golomb parameter s (S470). For example, the parameter decoding unit 470 obtains and outputs the quantized value of the Golomb parameter s corresponding to the parameter code as the Golomb parameter s using the decoding processing corresponding to the scalar quantization performed by the parameter determination unit 420 of the encoding apparatus 400.

[Integer Decoding Unit 460]

The integer code input to the decoding apparatus 450 and the Golomb parameter s output by the parameter decoding unit 470 are input to the integer decoding unit 460. If the Golomb parameter s is 1 or more, the integer decoding unit 460 rounds the Golomb parameter s to an integer value using a method that is the same as that performed by the integer encoding unit 410 of the encoding apparatus 400, and thereafter obtains and outputs the integer series $x_1, x_2, \ldots,$ and $x_N$ by performing Golomb decoding using the Golomb parameter s on the integer code, and if the Golomb parameter s is less than 1, the integer decoding unit 460 obtains the encoding parameter L from the Golomb parameter s using processing that is the same as that performed by the integer encoding unit 410 of the sixth embodiment, and uses the obtained encoding parameter L to obtain and output the integer series $x_1, x_2, \ldots,$ and $x_N$ through processing that is the same as any processing performed by the integer decoding unit 160 of the third to fifth embodiments (S460).

According to the embodiment of the present invention, it is possible to perform encoding with a low average bit count by using the encoding parameter L that is optimal for the series of integer values or a partial series thereof. Also, this kind of code can be decoded.

Variation 1 of Sixth Embodiment

Although encoding and decoding processing combined with Golomb encoding and decoding was performed in the sixth embodiment, the encoding and decoding processing need not be combined with Golomb encoding and decoding. A mode in which the encoding and decoding processing is not combined with Golomb encoding and decoding will be described as Variation 1 of the sixth embodiment (see FIGS. 16 and 17). The encoding apparatus 400 of Variation 1 of the sixth embodiment and the encoding apparatus 400 of the sixth embodiment differ in only the operation of the integer encoding unit 410. Also, the decoding apparatus 450 of Variation 1 of the sixth embodiment and the decoding apparatus 450 of the sixth embodiment differ in only the operation of the integer decoding unit 460. In view of this, operations of the integer encoding unit 410 and operations of the integer decoding unit 460 will be described hereinafter.

[Integer Encoding Unit 410]

The N samples of the integer series $x_1, x_2, \ldots,$ and $x_N$ of the series of integer values input to the encoding apparatus 400 and the Golomb parameter s output by the parameter determination unit 420 are input to the integer encoding unit 410. If the Golomb parameter s is 1 or more, the integer encoding unit 410 uses 2 as the encoding parameter L and obtains and outputs the integer code through processing that is the same as any processing performed by the integer encoding unit 110 of the third to fifth embodiments, and if the Golomb parameter s is less than 1, the integer encoding unit 410 obtains the encoding parameter L from the Golomb parameter s through processing that is the same as that performed by the integer encoding unit 410 of the sixth embodiment, and uses the obtained encoding parameter L to obtain and output the integer code through processing that is the same as any processing performed by the integer encoding units 110 of the third to fifth embodiments (S410). Note that if the encoding parameter L is a value between 1 and 2, for example, the rounded integer value may be set to 2.

[Integer Decoding Unit 460]

The integer code input to the decoding apparatus 450 and the Golomb parameter s output by the parameter decoding unit 470 are input to the integer decoding unit 460. If the Golomb parameter s is 1 or more, the integer decoding unit 460 uses 2 as the encoding parameter L and obtains and outputs the integer series $x_1, x_2, \ldots,$ and $x_N$ through processing that is the same as any processing performed by the integer decoding units 160 of the third to fifth embodiments, and if the Golomb parameter s is less than 1, the integer decoding unit 460 obtains the encoding parameter L from the Golomb parameter s through processing that is the same as that performed by the integer encoding unit 410 of Variation 1 of the sixth embodiment, and uses the obtained encoding parameter L to obtain and output the integer series $x_1, x_2, \ldots,$ and $x_N$ through processing that is the same as any processing performed by the integer decoding units 160 of the third to fifth embodiments (S460).

Variation 2 of Sixth Embodiment

In the sixth embodiment, a configuration was used in which if the Golomb parameter s is less than 1, the integer encoding unit 410 obtained the encoding parameter L from the Golomb parameter s, but it is also possible to use a configuration in which if the Golomb parameter s is less than 1, the parameter determination unit 420 directly obtains the encoding parameter L from the integer series. This mode will be described hereinafter as Variation 2 of the sixth embodiment (see FIGS. 16 and 17).

[Parameter Determination Unit 420]

The parameter determination unit 420 of the sixth embodiment was configured such that regardless of the value of the Golomb parameter, the Golomb parameter and the parameter code corresponding to the Golomb parameter are output without fail. However, if the Golomb parameter s is 1 or more, the parameter determination unit 420 of Variation 2 of the sixth embodiment outputs the Golomb parameter s and the parameter code corresponding to the Golomb parameter s, and if the Golomb parameter s is less than 1, the parameter determination unit 420 of Variation 2 of the sixth embodiment obtains the encoding parameter L from the integer series and outputs the encoding parameter L and the parameter code corresponding to the encoding parameter L (S420).

For example, the parameter determination unit 420 uses the integer values included in the input integer series $x_1, x_2, \ldots,$ and $x_N$ to obtain the encoding parameter L using Expression (7a).

[Formula 9]

$$L = \left\{ \log_2 \left( 1 + \frac{1}{N} \sum_{n=1}^{N} x_n \right) \right\}^{-1} \quad (7a)$$

The encoding parameter L obtained using Expression (7a) maximizes the log likelihood for the distribution $p(x, 1-2^{-1/L})$ based on Expression (4b) for the integer series $x_1, x_2, \ldots,$ and $x_N$. Note that, as will be described later, the encoding parameter L or the Golomb parameter s used by the integer encoding unit 410 in the encoding processing is not the value of the encoding parameter L obtained by the parameter determination unit 420, but is obtained by setting the encoding parameter L or the Golomb parameter s obtained based on the encoding parameter L to an integer value. In view of this, the parameter determination unit 420 may also obtain the encoding parameter L using, for example, the following Expression (7b), which approximates Expression (7a), instead of using Expression (7a).

[Formula 10]

$$L = (\ln 2) \left( \frac{1}{N} \sum_{n=1}^{N} x_n \right)^{-1} \quad (7b)$$

That is, Expression (7a) and Expression (7b) are merely examples, and the parameter determination unit 420 need only obtain an encoding parameter L according to which one of the likelihood, the estimated value of the likelihood, the log likelihood, and the estimated value of the log likelihood for the exponential distribution $p(x, 1-2^{-1/L})$ reaches its maximum for the integer series $x_1, x_2, \ldots,$ and $x_N$.

Also, the parameter determination unit 420 subjects the encoding parameter L obtained using the above-described processing to, for example, scalar quantization to obtain a code, and outputs the quantized value of the encoding parameter L corresponding to the code as the encoding parameter L.

The parameter code need only be a code according to which the corresponding decoding apparatus 450 can specify the value of the Golomb parameter s and the value of the encoding parameter L. For example, the parameter determination unit 420 need only be configured such that the same code is not included in the code group of parameter codes allocated to the Golomb parameter s and the code group of parameter codes allocated to the encoding parameter L by adding the 1-bit code "1" to the front of the code obtained by encoding the Golomb parameter s and setting the result as the parameter code, adding the 1-bit code "0"

to the front of the code obtained by encoding the encoding parameter L and setting the result as the parameter code, or the like.

[Integer Encoding Unit 410]

The N samples of the integer series $x_1, x_2, \ldots,$ and $x_N$ of the series of integer values input to the encoding apparatus 400 and the Golomb parameter s or the encoding parameter L output by the parameter determination unit 420 are input to the integer encoding unit 410. If the Golomb parameter s is input, the integer encoding unit 410 rounds the Golomb parameter s to an integer value, performs Golomb encoding using the Golomb parameter s of the integer value on the integer series $x_1, x_2, \ldots,$ and $x_N$ and outputs the code obtained through the Golomb encoding as an integer code, and if the encoding parameter L is input, the integer encoding unit 410 rounds the encoding parameter L to an integer value and uses the encoding parameter L of the integer value to obtain and output an integer code through processing that is the same as any processing performed by the integer encoding units 110 of the third to fifth embodiments (S410). Note that if the encoding parameter L is a value between 1 and 2, for example, the rounded integer value may be set to 2.

[Parameter Decoding Unit 470]

Although the parameter decoding unit 470 of the sixth embodiment obtained the Golomb parameter by decoding the parameter code, the parameter decoding unit 470 of Variation 2 of the sixth embodiment decodes the parameter code to obtain and output the Golomb parameter s or the encoding parameter L (S470).

[Integer Decoding Unit 460]

The integer code input to the decoding apparatus 450 and the Golomb parameter s or the encoding parameter L output by the parameter decoding unit 470 are input to the integer decoding unit 460. If the Golomb parameter s is input, the integer decoding unit 460 rounds the Golomb parameter s to an integer value using a method that is the same as that performed by the integer encoding unit 410 of the encoding apparatus 400, and thereafter obtains and outputs the integer series $x_1, x_2, \ldots,$ and $x_N$ by performing Golomb decoding using a Golomb parameter s of an integer value on the integer code, and if the encoding parameter L is input, the integer decoding unit 460 rounds the encoding parameter L to an integer value using a method that is the same as that performed by the integer encoding unit 410 of the encoding apparatus 400, and thereafter uses the encoding parameter L of the integer value to obtain and output the integer series $x_1, x_2, \ldots,$ and $x_N$ using processing that is the same as any processing performed by the integer decoding units 160 of the third to fifth embodiments (S460).

Seventh Embodiment

With the encoding apparatus of the sixth embodiment, the Golomb parameter s was first obtained, and the encoding parameter L was obtained based on the obtained Golomb parameter s. However, the encoding parameter L may also be estimated directly from the input series of integers by estimating a plausible L for an exponential distribution $p(x, 1-2^{-1/L})$ for which the code of the present invention is optimal. In this case, the Golomb code can be interpreted as the code of the present invention using L, which has a value that is 1 or less. Accordingly, the optimal encoding parameter L may also be obtained directly from the partial series of the input series composed of integer values, and the input series of integer values may also be encoded by combining the processing performed by the integer encoding unit 110 of the third to fifth embodiments using the obtained encoding parameter L and Golomb encoding, and decoding corresponding to the encoding may be performed. This mode will be described as a seventh embodiment.

<<Encoding Apparatus>>

A processing procedure of an encoding method executed by the encoding apparatus 400 of the seventh embodiment will be described with reference to FIGS. 16 and 17. As shown in FIG. 16, the encoding apparatus 400 of the seventh embodiment includes a parameter determination unit 420 and an integer encoding unit 410. The encoding method of the seventh embodiment is realized due to the encoding apparatus 400 of the seventh embodiment executing the processing of the steps shown in FIG. 17.

Similarly to the third to sixth embodiments, a series of non-negative integer values is input to the encoding apparatus 400 of the seventh embodiment. N samples of the series of non-negative integer values input to the encoding apparatus 400 of the seventh embodiment are input to the parameter determination unit 420 and the integer encoding unit 410. That is, the encoding apparatus 400 of the seventh embodiment encodes, in units of frames composed of N samples, the series of integer values, such as a series composed of absolute values of integer values obtained by, for example, converting audio, music, or the like collected by a microphone into a digital signal and performing quantization.

Hereinafter, a non-negative integer value input to the encoding apparatus of the present embodiment will be referred to simply as an "integer value" in the description.

[Parameter Determination Unit 420]

An integer series $x_1, x_2, \ldots, x_N$ of N samples among a series of integer values input to the encoding apparatus 400 is input to the parameter determination unit 420. Based on the input integer series $x_1, x_2, \ldots,$ and $x_N$, the parameter determination unit 420 obtains and outputs an encoding parameter L that corresponds to the integer series and a parameter code, which is a code indicating the parameter (S420). The parameter code need only be obtained by encoding the encoding parameter L such that the decoding apparatus 450 can obtain the encoding parameter L determined by the parameter determination unit 420 by decoding the parameter code.

The parameter determination unit 420 obtains an encoding parameter L according to which one of the likelihood, the estimated value of the likelihood, the log likelihood, and the estimated value of the log likelihood for the exponential distribution $p(x, 1-2^{-1/L})$ reaches its maximum for the input integer series $x_1, x_2, \ldots,$ and $x_N$. The processing for obtaining this encoding parameter L is as described above in the description of the parameter determination unit 420 of Variation 2 of the sixth embodiment, and for example, the parameter determination unit 420 obtains the encoding parameter L through Expression (7a) or Expression (7b) using the integer values included in the input integer series $x_1, x_2, \ldots,$ and $x_N$.

Also, the parameter determination unit 420 subjects the encoding parameter L obtained using the above-described processing to, for example, scalar quantization to obtain a code, outputs the obtained code as the parameter code, and outputs the quantized value of the encoding parameter L corresponding to the parameter code as the encoding parameter L.

[Integer Encoding Unit 410]

The N samples of the integer series $x_1, x_2, \ldots,$ and $x_N$ of the series of integer values input to the encoding apparatus 400 and the encoding parameter L output by the parameter determination unit 420 are input to the integer encoding unit 410. If the encoding parameter L is 1 or less, the integer encoding unit 410 obtains the value of s through later-described processing based on the encoding parameter L, rounds the value s to an integer value by rounding off the first decimal value of the obtained s or the like to obtain the Golomb parameter s, uses the obtained Golomb parameter s to perform Golomb encoding using the Golomb parameter s on the integer series $x_1, x_2, \ldots,$ and $x_N$, and outputs the code obtained through Golomb encoding as the integer code, and if the encoding parameter L is greater than 1, the integer encoding unit 410 rounds the value of L to an integer value by rounding off the first decimal value of the encoding parameter L, and thereafter uses the encoding parameter L of the integer value to obtain and output an integer code through processing that is the same as any processing performed by the integer encoding units 110 of the third to fifth embodiments (S410). Note that if the encoding parameter L is a value between 1 and 2, for example, the rounded integer value may be set to 2.

The processing for obtaining the value s based on the encoding parameter L is performed by obtaining the value of s at which the exponential distribution $p(x, 1-2^{-1/L})$ expressed using L and the exponential distribution $p(x, 2^{-1/s})$ expressed using s are the same, or by obtaining the value of s at which the exponential distribution $p(x, 1-2^{-1/L})$ expressed using L can be approximated using the exponential distribution $p(x, 2^{-1/s})$ expressed using s. That is, the value of s is obtained based on the encoding parameter L so as to obtain a relationship in which the exponential distribution $p(x, 1-2^{-1/L})$ expressed using L and the exponential distribution $p(x, 2^{-1/s})$ expressed using s are the same or similar. For example, the value of s is obtained based on the encoding parameter L using Expression (8a), which is a formula for converting to s from L, which is derived directly from $p(x, 1-2^{-1/L})=p(x, 2^{-1/s})$.

[Formula 11]

$$s=-(\log_2(1-2^{-1/L}))^{-1} \quad (8a)$$

Also, for example, the value of s may also be obtained using Expression (8b), which is obtained by approximating the above-described Expression (8a), as the value of s at which the exponential distribution $p(x, 1-2^{-1/L})$ expressed using L is approximated using the exponential distribution $p(x, 2^{-1/s})$ expressed using s.

[Formula 12]

$$s=(\log_2 L+1)^{-1} \quad (8b)$$

<<Decoding Apparatus>>

A processing procedure of a decoding method executed by a decoding apparatus 450 of the seventh embodiment will be described with reference to FIGS. 18 and 19. As shown in FIG. 18, the decoding apparatus 450 of the seventh embodiment includes a parameter decoding unit 470 and an integer decoding unit 460. The decoding method of the seventh embodiment is realized due to the decoding apparatus 450 of the seventh embodiment executing the processing of the steps shown in FIG. 19.

The integer code and the parameter code output by the encoding apparatus 400 of the seventh embodiment are input to the decoding apparatus 450 of the seventh embodiment. The integer code and the parameter code input to the decoding apparatus 450 are input to the parameter decoding unit 470 and the integer decoding unit 460 for each code corresponding to N samples of the series of integer values.

That is, the decoding apparatus 450 performs decoding processing on each frame that is the same as in the encoding apparatus 400.

[Parameter Decoding Unit 470]

The parameter code input to the decoding apparatus 450 is input to the parameter decoding unit 470. The parameter decoding unit 470 decodes the parameter code through decoding processing corresponding to the processing used by the parameter determination unit 420 to obtain the parameter code, and obtains and outputs the encoding parameter L (S470). For example, the parameter decoding unit 470 obtains and outputs the quantized value of the encoding parameter L corresponding to the parameter code as the encoding parameter L through decoding processing corresponding to the scalar quantization performed by the parameter determination unit 420 of the encoding apparatus 400.

[Integer Decoding Unit 460]

The integer code input to the decoding apparatus 450 and the encoding parameter L output by the parameter decoding unit 470 are input to the integer decoding unit 460. If the encoding parameter L is 1 or less, the integer decoding unit 460 obtains the Golomb parameter s from the encoding parameter L through processing that is the same as that performed by the integer encoding unit 410 of the seventh embodiment, uses the obtained Golomb parameter s to perform Golomb decoding using the Golomb parameter s on the integer code, and obtains and outputs the integer series $x_1, x_2, \ldots,$ and $x_N$, and if the encoding parameter L is greater than 1, the integer compounding unit 460 rounds the encoding parameter L to an integer value through a method that is the same as that performed by the integer encoding unit 410 of the encoding apparatus 400, and thereafter uses the encoding parameter L of the integer value to obtain and output the integer series $x_1, x_2, \ldots,$ and $x_N$ through processing that is the same as any processing performed by the integer decoding units 160 of the third to fifth embodiments (S460).

According to the embodiment of the present invention, it is possible to perform encoding with a low average bit count by using the encoding parameter L that is optimal for the series of integer values or a partial series thereof. Also, this kind of code can be decoded.

Variation 1 of Seventh Embodiment

In the seventh embodiment, encoding and decoding processing combined with Golomb encoding and decoding was performed, but the encoding and decoding processing need not be combined with Golomb encoding and decoding. A mode in which the encoding and decoding processing is not combined with Golomb encoding and decoding will be described as Variation 1 of the seventh embodiment (see FIGS. 16 and 17). The encoding apparatus 400 of Variation 1 of the seventh embodiment and the encoding apparatus 400 of the seventh embodiment differ in only the operation of the integer encoding unit 410. Also, the decoding apparatus 450 of Variation 1 of the seventh embodiment and the decoding apparatus 450 of the seventh embodiment differ in only the operation of the integer decoding unit 460. In view of this, operations of the integer encoding unit 410 and operations of the integer decoding unit 460 will be described hereinafter.

[Integer Encoding Unit 410]

The N samples of the integer series $x_1, x_2, \ldots,$ and $x_N$ of the series of integer values input to the encoding apparatus 400 and the encoding parameter L output by the parameter determination unit 420 are input to the integer encoding unit 410. If the encoding parameter L of the integer value is 1 or less after the value of L is rounded to an integer value by rounding off the first decimal value of the input encoding parameter L or the like, the integer encoding unit 410 uses 2 as the encoding parameter L to obtain and output the integer code through processing that is the same as any processing performed by the integer encoding units 110 of the third to fifth embodiments, and if the encoding parameter L of the integer value is greater than 1, the integer encoding unit 410 uses the encoding parameter L of the integer value to obtain and output the integer code through processing that is the same as any processing performed by the integer encoding units 110 of the third to fifth embodiments (S410).

[Integer Decoding Unit 460]

The integer code input to the decoding apparatus 450 and the encoding parameter L output by the parameter decoding unit 470 are input to the integer decoding unit 460. If the encoding parameter L of the integer value is 1 or less after the input encoding parameter L is rounded to an integer value using the same method as that performed by the integer encoding unit 410 of the encoding apparatus 400, the integer decoding unit 460 uses 2 as the encoding parameter L to obtain and output the integer series $x_1, x_2, \ldots,$ and $x_N$ through processing that is the same as any processing performed by the integer decoding units 160 of the third to fifth embodiments, and if the encoding parameter L of the integer value is greater than 1, the integer decoding unit 460 uses the encoding parameter L of the integer value to obtain and output the integer series $x_1, x_2, \ldots,$ and $x_N$ through processing that is the same as any processing performed by the integer decoding units 160 of the third to fifth embodiments (S460).

Variation 2 of Seventh Embodiment

In the seventh embodiment, a configuration was used in which the integer encoding unit 410 obtains the Golomb parameter s based on the encoding parameter L if the encoding parameter L is 1 or less. However, it is also possible to use a configuration in which the parameter determination unit 420 directly obtains the Golomb parameter s from the integer series if the encoding parameter L is 1 or less. This mode will be described hereinafter as Variation 2 of the seventh embodiment (see FIGS. 16 and 17).

[Parameter Determination Unit 420]

The parameter determination unit 420 of the seventh embodiment was configured to always output the encoding parameter L and the parameter code corresponding to the encoding parameter L regardless of the value of the encoding parameter L. However, if the encoding parameter L is greater than 1, the parameter determination unit 420 of Variation 2 of the seventh embodiment outputs the encoding parameter L and the parameter code corresponding to the encoding parameter L, and if the encoding parameter L is 1 or less, the parameter determination unit 420 obtains the Golomb parameter s from the integer series through Expression (5) and outputs the Golomb parameter s and the parameter code corresponding to the Golomb parameter s (S420). In this case, similarly to Variation 2 of the sixth embodiment, the parameter code need only be a code according to which the corresponding decoding apparatus 450 can uniquely specify the value of the Golomb parameter s and the value of the encoding parameter L.

[Integer Encoding Unit 410]

The N samples of the integer series $x_1, x_2, \ldots,$ and $x_N$ of the series of integer values input to the encoding apparatus 400 and the encoding parameter L or the Golomb parameter s output by the parameter determination unit 420 are input to the integer encoding unit 410. If the Golomb parameter s is input, the integer encoding unit 410 rounds the value of the Golomb parameter s to an integer value, performs Golomb encoding using the Golomb parameter s of the integer value on the integer series $x_1, x_2, \ldots,$ and $x_N$, and outputs the code obtained through Golomb encoding as the integer code, and if the encoding parameter L is input, the integer encoding unit 410 rounds the encoding parameter L to an integer value and uses the encoding parameter L of the integer value to obtain and output an integer code through processing that is the same as any processing performed by the integer encoding unit 110 of the third to fifth embodiments (S410). Note that if the encoding parameter L is a value between 1 and 2, for example, the rounded integer value may be set to 2.

[Parameter Decoding Unit 470]

Although the parameter decoding unit 470 of the seventh embodiment decoded the parameter code to obtain the encoding parameter L, the parameter decoding unit 470 of Variation 2 of the seventh embodiment decodes the parameter code to obtain and output the encoding parameter L or the Golomb parameter s (S470).

[Integer Decoding Unit 460]

The integer code input to the decoding apparatus 450 and the encoding parameter L or the Golomb parameter s output by the parameter decoding unit 470 are input to the integer decoding unit 460. If the Golomb parameter s is input, the integer decoding unit 460 rounds the value of the Golomb parameter s to an integer value through a method that is the same as that performed by the integer encoding unit 410 of the encoding apparatus 400, performs Golomb decoding using the Golomb parameter s of the integer value on the integer code, and obtains and outputs the integer series $x_1, x_2, \ldots,$ and $x_N$, and if the encoding parameter L is input, the integer decoding unit 460 rounds the encoding parameter L to an integer value through a method that is the same as that performed by the integer encoding unit 410 of the encoding apparatus 400, and thereafter uses the encoding parameter L of the integer value to obtain and output the integer series $x_1, x_2, \ldots,$ and $x_N$ through processing that is the same as any processing performed by the integer decoding units 160 of the third to fifth embodiments (S460).

Other Variations of Sixth Embodiment and Seventh Embodiment

Note that since the Golomb parameter s and the encoding parameter L can be mutually converted through Expressions (6a), (6b), (8a), and (8b) based on the fact that the exponential distribution $p(x, 2^{-1/s})$ expressed using s and the exponential distribution $p(x, 1-2^{-1/L})$ expressed using L are in a relationship of being the same or similar, the parameter that is the subject of encoding and decoding and the above-described conversion may be used in any combination, as long as the same values of the same parameters can be used in the integer encoding unit 410 of the encoding apparatus 400 and the integer decoding unit 460 of the decoding apparatus 450. Also, as long as the same values of the same parameters can be used in the integer encoding unit 410 of the encoding apparatus 400 and the integer decoding unit 460 of the decoding apparatus 450, the value of either the Golomb parameter s or the encoding parameter L may be subjected to rounding processing, the encoded or unencoded value (i.e., the quantized or unquantized value) of the parameter may be subjected to rounding processing, and the quantization and rounding processing of a value in the encoding may also be performed simultaneously. In short, the sixth embodiment, the seventh embodiment, Variation 1, and Variation 2 are merely examples, and it is sufficient that the encoding processing and the decoding processing performed using the same values of the same parameters can be performed by the integer encoding unit 410 of the encoding apparatus 400 and the integer decoding unit 460 of the decoding apparatus 450 on each frame composed of N samples.

Also, since a Golomb code using s that is a power of 2 is a Golomb-Rice code as described above, it is also possible to use a Rice parameter r instead of a Golomb parameter s, or to use Golomb-Rice encoding and Golomb-Rice decoding instead of Golomb encoding and Golomb decoding. Note that the Rice parameter r and the encoding parameter L can be mutually converted using a formula combining $s=2^r$, which is a formula expressing the relationship between the Golomb parameter s and the Rice parameter r, and a formula which converts between the Golomb parameter s and the encoding parameter L, for example, Expression (9) and Expression (10) below. That is, it is also possible to obtain the encoding parameter L based on the Rice parameter r and to obtain the Rice parameter r based on the encoding parameter L so as to obtain a relationship in which the exponential distribution $p(x, 2^{-1/s})$ expressed using s, which is $2^r$, and the exponential distribution $p(x, 1-2^{-1/L})$ expressed using L are the same or similar.

[Formula 13]

$$L = 2^{\left(\frac{1}{2^r}-1\right)} \quad (9)$$

$$r = \log_2\left(\frac{1}{1+\log_2 L}\right) \quad (10)$$

Eighth Embodiment

In the sixth embodiment and the seventh embodiment, a mode was described in which the encoding and decoding of the present embodiment are realized by performing the encoding and decoding of the third to fifth embodiments using the Golomb parameter s, the Rice parameter r, and the encoding parameter L obtained for a partial series of a series composed of input integer values. In the eighth embodiment, a mode in which encoding and decoding of the present invention are realized using at least one of the Golomb parameter s, the Rice parameter r, and the encoding parameter L will be described.

<<Encoding Apparatus>>

A processing procedure of an encoding method executed by the encoding apparatus 400 of the eighth embodiment will be described with reference to FIGS. 16 and 17. As shown in FIG. 16, the encoding apparatus 400 of the eighth embodiment includes a parameter determination unit 420 and an integer encoding unit 410. The encoding method of the eighth embodiment is realized due to the encoding apparatus 400 of the eighth embodiment executing the processing of the steps shown in FIG. 17.

A series of non-negative integer values are input to the encoding apparatus 400 of the eighth embodiment. N samples of the series of non-negative integer values input to the encoding apparatus 400 of the eighth embodiment are input to the parameter determination unit 420 and the integer encoding unit 410.

Hereinafter, a non-negative integer value input to the encoding apparatus of the present embodiment will be referred to simply as an "integer value" in the description.

[Parameter Determination Unit 420]

An integer series $x_1, x_2, \ldots, x_N$ of N samples among a series of integer values input to the encoding apparatus 400 is input to the parameter determination unit 420. Based on the input integer series $x_1, x_2, \ldots,$ and $x_N$, the parameter determination unit 420 obtains and outputs at least one of the Golomb parameter s, the Rice parameter r, and the encoding parameter L corresponding to the integer series, and a parameter code indicating at least one of the Golomb parameter s, the Rice parameter r, and the encoding parameter L (S420). That is, the parameter determination unit 420 performs at least one of processing for obtaining the Golomb parameter s based on the integer values included in the integer series, processing for obtaining the Rice parameter r based on the integer values included in the integer series, and processing for obtaining the encoding parameter L at which one of the likelihood, the estimated value of the likelihood, the log likelihood, and the estimated value of the log likelihood with respect to the exponential distribution $p(x_n, 1-2^{-1/L})$ for the integer series, and processing for encoding at least one of the Golomb parameter s, the Rice parameter r, and the encoding parameter L to obtain the parameter code, for each integer series, which is a series composed of a predetermined number of samples of integer values included in an input series of non-negative integer values.

[Integer Encoding Unit 410]

The N samples of the integer series $x_1, x_2, \ldots,$ and $x_N$ of the series of integer values input to the encoding apparatus 400 and at least one of the Golomb parameter s, the Rice parameter r, and the encoding parameter L output by the parameter determination unit 420 are input to the integer encoding unit 410. If the encoding parameter L is input, the integer encoding unit 410 uses the input encoding parameter L to obtain and output an integer code through processing that is the same as any processing of the integer encoding units 110 of the third to fifth embodiments, and if the Golomb parameter s is input, the integer encoding unit 410 uses the encoding parameter L obtained based on the input Golomb parameter s to obtain and output the integer code through processing that is the same as any processing performed by the integer encoding units 110 of the third to fifth embodiments, and if the Rice parameter r is input, the integer encoding unit 410 uses the encoding parameter L obtained based on the input Rice parameter r to obtain and output an integer code through processing that is the same as any processing performed by the integer encoding units 110 of the third to fifth embodiments (S410). That is, for each integer series, which is a series composed of a predetermined number of samples of integer values, the integer encoding unit 410 obtains the codes of the code A and the code B using, as the encoding parameter L, the encoding parameter L obtained by the parameter determination unit 420, the encoding parameter L obtained based on the Golomb parameter s obtained by the parameter determination unit 420 so as to obtain a relationship in which the exponential distribution $p(x, 2^{-1/s})$ expressed using s and the exponential distribution $p(x, 1-2^{-1/L})$ expressed using L are the same or similar, or the encoding parameter L obtained based on the Rice parameter r obtained by the parameter determination unit 420 so as to obtain a relationship in which the exponential distribution $p(x, 2^{-1/s})$ expressed using s, which is $2^r$, and the exponential distribution $p(x, 1-2^{-1/L})$ expressed using L are the same or similar. Note that if the encoding parameter L corresponding to the integer series is 1 or less, if the Golomb parameter s corresponding to the integer series is 1 or more, or if the Rice parameter r corresponding to the integer series is non-negative, the code string may also be obtained and output as an integer code by subjecting the integer series to Golomb encoding or Golomb-Rice encoding.

<<Decoding Apparatus>>

A processing procedure of a decoding method executed by a decoding apparatus 450 of the eighth embodiment will be described with reference to FIGS. 18 and 19. As shown in FIG. 18, the decoding apparatus 450 of the eighth embodiment includes a parameter decoding unit 470 and an integer decoding unit 460. The decoding method of the eighth embodiment is executed due to the decoding apparatus 450 of the eighth embodiment executing the processing of the steps shown in FIG. 19.

The integer code and the parameter code output by the encoding apparatus 400 of the eighth embodiment are input to the decoding apparatus 450 of the eighth embodiment. The integer code and the parameter code input to the decoding apparatus 450 are input to the parameter decoding unit 470 and the integer decoding unit 460 for each code corresponding to N samples of the series of integer values. That is, the parameter code and the code string of each predetermined unit are input to the parameter decoding unit 470 and the integer decoding unit 460.

[Parameter Decoding Unit 470]

The parameter decoding unit 470 obtains and outputs at least one of the Golomb parameter s, the Rice parameter r, and the encoding parameter L by decoding the parameter code using the decoding processing corresponding to that used by the parameter determination unit 420 to obtain the parameter code (S470). That is, the parameter decoding unit 470 obtains at least one of the Golomb parameter s, the Rice parameter r, and the encoding parameter L by decoding the parameter code for each predetermined unit.

[Integer Decoding Unit 460]

The integer code input to the decoding apparatus 450, and at least one of the Golomb parameter s, the Rice parameter r, and the encoding parameter L output by the parameter decoding unit 470 are input to the integer decoding unit 460. If the encoding parameter L is input, the integer decoding unit 460 uses the input encoding parameter L to obtain and output the integer series $x_1, x_2, \ldots, x_N$ through processing that is the same as any processing performed by the integer decoding units 160 of the third to fifth embodiments, if the Golomb parameter s is input, the integer decoding unit 460 uses the encoding parameter L obtained based on the input Golomb parameter s to obtain and output the integer series $x_1, x_2, \ldots, x_N$ through processing that is the same as any processing performed by the integer decoding units 160 of the third to fifth embodiments, and if the Rice parameter r is input, the integer decoding unit 460 uses the encoding parameter L obtained based on the input Rice parameter r to obtain and output the integer series $x_1, x_2, \ldots, x_N$ through processing that is the same as any processing performed by the integer decoding units 160 of the third to fifth embodiments (S460). That is, for each predetermined unit, the integer decoding unit 460 obtains a series of integer values composed of the L consecutive integer values 0 and the set composed of 0 to L−1 consecutive integer values 0 and one integer value $x_n$ other than 0 using, as the encoding parameter L, the encoding parameter L obtained by the parameter decoding unit 470, the encoding parameter L obtained based on the Golomb parameter s obtained by the parameter decoding unit 470 so as to achieve a relationship in which the exponential distribution $p(x, 2^{-1/s})$ expressed using s and the exponential distribution $p(x, 1-2^{-1/L})$ expressed using L are the same or similar, or the encoding parameter L obtained based on the Rice parameter r obtained by the parameter decoding unit 470 so as to obtain a relationship in which the exponential distribution $p(x, 2^{-1/s})$ expressed using s, which is $2^r$, and the exponential distribution $p(x, 1-2^{-1/L})$ expressed using L are the same or similar. Note that if the encoding parameter L is 1 or less, if the Golomb parameter s is 1 or more, or if the Rice parameter r is non-negative, the series of integer values may also be obtained and output by subjecting the code string to Golomb decoding or Golomb-Rice decoding.

According to the embodiment of the present invention, it is possible to perform encoding with a low average bit count by using the encoding parameter L that is optimal for the series of integer values or a partial series thereof. Also, this kind of code can be decoded.

APPENDIX

For example, the apparatus of the present invention includes, as single hardware entities, an input unit to which a keyboard and the like can be connected, an output unit to which a liquid crystal display or the like can be connected, a communication unit to which a communication apparatus (e.g., a communication cable) that can be connected to the outside of the hardware entity can be connected, a CPU (Central Processing Unit; may also include a cache memory, a register, or the like), a RAM and a ROM, which are memories, an external storage apparatus, which is a hard disk, and a bus that is connected such that data can be exchanged between the input unit, the output unit, the communication unit, the CPU, the RAM, the ROM, and the external storage apparatus. Also, an apparatus (drive) or the like that can read from and write to a storage medium such as a CD-ROM may also be provided in the hardware entity as needed. Examples of physical entities that include this kind of hardware resource include general purpose computers and the like.

Programs that are needed in order to realize the above-described functions, data that is needed in processing of the programs, and the like are stored in the external storage apparatus of the hardware entity (there is no limitation to an external storage apparatus, and for example, the programs may also be storage in a ROM, which is a read-only storage apparatus). Also, the data that is obtained through the processing of these programs and the like are appropriately stored in the RAM, the external storage apparatus, or the like.

With the hardware entity, the programs stored in the external storage apparatus (or the ROM, etc.) and the data that is needed for the processing of the programs is read to the memory as needed, and is interpreted, executed, and processed by the CPU as appropriate. As a result, the CPU realizes a predetermined function (the constituent elements expressed above as . . . units, . . . means, and the like).

The present invention is not limited to the above-described embodiments, and various modifications are possible without departing from the gist of the present invention.

For example, in the above-described embodiments, an example was described in which the series of non-negative integer values input to the encoding apparatus is a series of absolute values of integer values obtained by quantizing signals obtained by converting sound, image, or video signals into digital signals to obtain finite-precision values.

However, the series of non-negative integer values input to the encoding apparatus may also be a series of absolute values of integer values obtained by quantizing signals other than those described above, such as chronological signals obtained based on a biological signal such as an electrocardiogram, a magnetocardiogram, an electroencephalogram, a surface electromyogram, or electrodermal activity, into finite-precision values.

Alternatively, the series of non-negative integer values input to the encoding apparatus may also be a series of absolute values of integer values obtained by quantizing not chronological signals, but signals obtained based on a medical image obtained based on, for example, computer tomography, magnetic resonance imaging, ultrasonic tomography, or angiography, to obtain finite-precision values. Furthermore, the series of non-negative integer values input to the encoding apparatus may also be a series of absolute values of integer values obtained by quantizing a series of numerical values that is not a signal, such as quality scores indicating measurement error relating to genes of a gene information series, for example, to obtain finite-precision values.

Also, the series of non-integer values input to the encoding apparatus may also be a series of absolute values of integer values obtained by converting signals obtained by converting, for example, sound, images, or video signals into digital signals, into frequency spectra using cosine transformation or the like, and thereafter performing quantization to obtain finite-precision values, and the series of non-integer values input to the encoding apparatus may also be, for example, a series of absolute values of integer values obtained by quantizing a series obtained by performing filter processing such as a high-pass filter or a low-pass filter on the above-described signals or a series of numerical values that is not a signal, to obtain finite-precision values.

In the encoding apparatus of the present invention, in order to handle these inputs, a conversion unit (not shown) may also be included before the encoding apparatus shown in FIG. 2 or FIG. 16 as a processing unit for converting a series of signals or numerical values input to the encoding apparatus into a series of non-negative integer values. Similarly, in the decoding apparatus of the present invention, in order to obtain an output that corresponds to the above-described input, an inverse conversion unit (not shown) may also be included after the integer decoding unit of FIG. 7 or FIG. 18 as a processing unit for converting a series of non-negative integer values obtained by the integer decoding unit into a series of signals or numerical values.

Also, the processing described in the above-described embodiment is not only executed chronologically according to the described sequence, but may also be executed in parallel or separately according to the processing capability of the apparatus executing the processing or according to need.

As described above, if the processing function of the hardware entity (the apparatus of the present invention) described in the above-described embodiments is to be realized by a computer, the processing content of the functions to be included in the hardware entity is described by the program. Also, the processing function of the above-described hardware entity is realized on a computer by executing the program using a computer.

The program describing the processing content can be stored in a computer-readable storage medium. The computer-readable recording medium may be, for example, a magnetic recording medium, an optical disk, a magneto-optical storage medium, a semiconductor memory, or the like. Specifically, for example, it is possible to use a hard disk apparatus, a flexible disk, magnetic tape, or the like as a magnetic recording apparatus, a DVD (Digital Versatile Disc), a DVD-RAM (Random Access Memory), a CD-ROM (Compact Disc Read Only Memory), a CD-R (Recordable)/RW (ReWritable), or the like as the optical disk, an MO (Magneto-Optical Disc) or the like as the magneto-optical recording medium, or an EEP-ROM (Electronically Erasable and Programmable-Read Only Memory) or the like as the semiconductor memory.

Also, distribution of this program is performed through, for example, sale, transfer, lending, or the like of a transportable recording medium such as a DVD or CD-ROM on which the program is recorded. Furthermore, it is also possible to use a configuration in which the program is distributed by storing the program in a storage apparatus of a server computer and transferring the program to another computer from the server computer via a network.

The computer that executes this kind of program first stores, for example, a program recorded in a transportable recording medium or a program transferred from the server computer in its own storage apparatus. Then, during execution of processing, the computer reads the program stored in the storage apparatus of the computer and executes processing according to the read program. Also, as another mode of executing the program, the computer may also read the program directly from the transportable recording medium and execute the program according to the program, or processing according to a received program may also be executed sequentially each time a program is transferred to the computer from the server computer. It is also possible to use a configuration in which the program is not transferred from the server computer to the computer, but the above-described processing is executed by a so-called ASP (Application Service Provider) service that realizes the processing function through only execution instruction and result acquisition. Note that it is assumed that the program of the present mode includes information provided for processing performed by an electronic computer and information conforming to the program (data and the like that is not a direct command to a computer but has a property defining the processing of the computer).

Also, although the hardware entity is constituted by causing the predetermined program to be executed in a computer in this mode, at least a portion of the processing content may also be realized using hardware.

The description of the embodiments of the above-described present invention is presented for the purposes of demonstration and description. The description is not intended to be comprehensive, and is not intended to limit the invention strictly to the form disclosed. Deformations and variations are possible as described above. The embodiments were selected and expressed in order to provide the best demonstration of the principle of the present invention, and in order to allow a person skilled in the art to use the present invention in various embodiments and with various variations added in order to be appropriate for a considered actual use. All such modifications and variations are within the scope of the present invention determined by the appended claims interpreted according to a scope applied justly, legally, and fairly.

The invention claimed is:

1. An encoding apparatus comprising processing circuitry configured to: execute an integer encoding processing which, for an input series of non-negative integer values $x_n$, $n \in \{1, 2, \ldots, N\}$ (hereinafter referred to as an "integer series"), obtains a 1-bit code with a bit value of "x"

(hereinafter referred to as "code A") as a code corresponding to L consecutive integer values 0 included in the integer series, and obtains, as a code corresponding to a set composed of 0 to L−1 consecutive integer values 0 and one integer value $x_n$ other than 0 included in the integer series, a $K \times x_n$-bit or $K \times x_n+1$-bit code (hereinafter referred to as "code B") that includes at least one bit value "x" and at least one bit value "y" in a first bit to a K-th bit, and in which the bit values of the $K \times (x_n-1)$ bits from the end are "y", wherein L numbers of 0 to L−1 consecutive integer values 0 in the integer series are in one-to-one correspondence with L partial codes, namely, (a) one partial code, which is constituted by K+1 bits from a first bit to a (K+1)-th bit of the code B when the code B is $K \times x_n+1$ bits, and in which the bit value of the first bit is "x" and the bit values of the second bit to the (K+1)-th bit are "y", (b) p−1 (i.e., $2^K-L-1$) partial codes, which are constituted by K bits from the first bit to the K-th bit of the code B when the code B is $K \times x_n$ bits, and in which the bit value of the first bit is "y" and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is $K \times x_n+1$ bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", where L is an integer that is 2 or more, K is the smallest natural number at which $2^K$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

2. The encoding apparatus according to claim 1, wherein the integer series is a series of a predetermined sample of integer values included in an input series of non-negative integer values, the encoding apparatus further comprises processing circuitry configured to: execute a parameter determination processing which performs, for each of the integer series, at least one of processing for obtaining a Golomb parameter s based on an integer value included in the integer series, processing for obtaining a Rice parameter r based on an integer value included in the integer series, and processing for obtaining an encoding parameter L at which one of a likelihood, an estimated value of a likelihood, a log likelihood, and an estimated value of a log likelihood with respect to an exponential distribution $p(x_n, 1-2^{-1/L})$ reaches its maximum for the integer series, and processing for encoding at least one of the Golomb parameter s, the Rice parameter r, and the encoding parameter L to obtain a parameter code, and for each of the integer series, the integer encoding processing uses, as the L, an encoding parameter L obtained by the parameter determination processing, an encoding parameter L obtained based on the Golomb parameter s obtained by the parameter determination processing so as to obtain a relationship in which an exponential distribution $p(x, 2^{-1/s})$ expressed using s and an exponent distribution $p(x, 1-2^{-1/L})$ expressed using L are the same or similar, or an encoding parameter L obtained based on the Rice parameter r obtained by the parameter determination processing so as to obtain a relationship in which the exponential distribution $p(x, 2^{-1/s})$ expressed using s, which is $2^r$, and the exponential distribution $p(x, 1-2^{-1/L})$ expressed using L are the same or similar.

3. The encoding apparatus according to claim 2, wherein if the encoding parameter L corresponding to the integer series is 1 or less, if the Golomb parameter s corresponding to the integer series is 1 or more, or if the Rice parameter r corresponding to the integer series is non-negative, the integer encoding processing performs Golomb encoding or Golomb-Rice encoding on the integer series to obtain a code string.

4. A non-transitory computer-readable storage medium which stores an encoding program for causing a computer to function as an encoding apparatus according to claim 1.

5. A decoding apparatus comprising processing circuitry configured to: execute an integer decoding processing which obtains a series of integer values $x_n$, $n \in \{1, 2, \ldots, N\}$ by, for an input code string, obtaining L consecutive integer values 0 based on a 1-bit code (hereinafter referred to as "code A") with a bit value of "x" included in the input code string, and obtaining a set of 0 to L−1 consecutive integer values 0 and one integer value $x_n$ other than 0 based on a $K \times x_n$-bit or $K \times x_n+1$-bit code (hereinafter referred to as "code B"), which is included in the input code string and includes at least one bit value "x" and at least one bit value "y" in a first bit to a K-th bit, and in which the bit values of the $K \times x_n-1$) bits from the end are "y", wherein L partial codes, namely, (a) one partial code, which is constituted by K+1 bits from a first bit to a (K+1)-th bit of the code B when the code B is $K \times x_n+1$ bits, and in which the bit value of the first bit is "x" and the bit values of the second bit to the (K+1)-th bit are "y", (b) p−1 (i.e., $2^K-L-1$) partial codes, which are constituted by K bits from the first bit to the K-th bit of the code B when the code B is $K \times x_n$ bits, and in which the bit value of the first bit is "y" and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is $K \times x_n+1$ bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", are in one-to-one correspondence with the L numbers of 0 to L−1 consecutive integer values 0 in the series of integer values obtained by the integer decoding processing, where L is an integer that is 2 or more, K is the smallest natural number at which $2^K$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

6. The decoding apparatus according to claim 5, wherein the integer decoding processing specifies the code A and the code B included in the input code string by, in order starting from the beginning of the input code string, reading K consecutive bits (hereinafter referred to as a "K-bit string") of the input code string, and when the read K-bit string includes "y", identifying that a bit immediately prior to the K-bit string including "y" is the code A or the final bit of the code B.

7. The decoding apparatus according to claim 5, further comprising processing circuitry configured to: execute a parameter decoding processing into which a parameter code and the code string for each predetermined unit are input, and which, for each predetermined unit, decodes the parameter code to obtain at least one of a Golomb parameter s, a Rice parameter r, and an encoding parameter L, wherein, for each predetermined unit, the integer decoding processing uses, as the L, an encoding parameter L obtained by the parameter decoding processing, an encoding parameter L obtained based on the Golomb parameter s obtained by the parameter decoding processing so as to obtain a relationship in which an exponential distribution $p(x, 2^{-1/s})$ expressed using s and an exponent distribution $p(x, 1-2^{-1/L})$ expressed using L are the same or similar, or an encoding parameter L obtained based on the Rice parameter r obtained by the parameter decoding processing so as to obtain a relationship in which the exponential distribution $p(x, 2^{-1/s})$ expressed using s, which is $2^r$, and the exponential distribution $p(x, 1-2^{-1/L})$ expressed using L are the same or similar.

8. The decoding apparatus according to claim 7, wherein if the encoding parameter L is 1 or less, if the Golomb parameter s is 1 or more, or if the Rice parameter r is non-negative, the integer decoding processing performs Golomb decoding or Golomb-Rice decoding on the code string to obtain a series of integer values.

9. A non-transitory computer-readable storage medium which stores a decoding program for causing a computer to function as a decoding apparatus according to claim 5.

10. A data structure of a code string indicating a series of integer values $x_n$, $n \in \{1, 2, \ldots, N\}$ (hereinafter referred to as an "integer series"), which are non-negative values, wherein the code string is to be used by an encoding apparatus configured to obtain the code string from the integer series, and/or a decoding apparatus configured to obtain the integer series from the code string, the data structure includes a 1-bit code (hereinafter referred to as "code A") with a bit value of "x" as a code corresponding to L consecutive integer values 0 included in the integer series, and a $K \times x_n$-bit or $K \times x_n+1$-bit code (hereinafter referred to as "code B"), which includes at least one bit value "x" and at least one bit value "y" in a first bit to a K-th bit and in which the bit values of the $K \times (x_n-1)$ bits from the end are "y", as a code corresponding to a set of 0 to L−1 consecutive integer values 0 and one integer value $x_n$ other than 0, included in the integer series, and the L numbers of 0 to L−1 consecutive integer values 0 in the integer series are in one-to-one correspondence with L partial codes, namely, (a) one partial code, which is constituted by K+1 bits from a first bit to a (K+1)-th bit of the code B when the code B is $K \times x_n+1$ bits, and in which the bit value of the first bit is "x" and the bit values of the second bit to the (K+1)-th bit are "y", (b) p−1 (i.e., $2^K-L-1$) partial codes, which are constituted by K bits from the first bit to the K-th bit of the code B when the code B is $K \times x_n$ bits, and in which the bit value of the first bit is "y" and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is $K \times x_n+1$ bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", where L is an integer that is 2 or more, K is the smallest natural number at which $2^1$ (is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

11. An encoding method of executing an integer encoding step in which an encoding apparatus obtains, for an input series of non-negative integer values $x_n$, $n \in \{1, 2, \ldots, N\}$ (hereinafter referred to as an "integer series"), as a code corresponding to L consecutive integer values 0 included in the integer series, a 1-bit code (hereinafter referred to as "code A") with a bit value of "x", and obtains, as a code corresponding to a set composed of 0 to L−1 consecutive integer values 0 and one integer value $x_n$ other than 0 included in the integer series, a $K \times x_n$-bit or $K \times x_n+1$-bit code (hereinafter referred to as "code B") that includes at least one bit value "x" and at least one bit value "y" in a first bit to a K-th bit, and in which the bit values of the $K \times (x_n-1)$ bits from the end are "y", wherein the L numbers of 0 to L−1 consecutive integer values 0 in the integer series are in one-to-one correspondence with L partial codes, namely, (a) one partial code, which is constituted by K+1 bits from a first bit to a (K+1)-th bit of the code B when the code B is $K \times x_n+1$ bits, and in which the bit value of the first bit is "x" and the bit values of the second bit to the (K+1)-th bit are "y", (b) p−1 (i.e., $2^K-L-1$) partial codes, which are constituted by K bits from the first bit to the K-th bit of the code B when the code B is $K \times x_n$ bits, and in which the bit value of the first bit is "y", and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is $K \times x_n+1$ bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", where L is an integer that is 2 or more, K is the smallest natural number at which $2^K$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

12. A decoding method of executing an integer decoding step in which a decoding apparatus obtains, for an input code string, a series of integer values $x_n$, $n \in \{1, 2, \ldots, N\}$ by obtaining L integer values 0 based on a 1-bit code (hereinafter referred to as "code A") with a bit value of "x" included in the input code string, and obtaining a set of 0 to L−1 consecutive integer values 0 and one integer value $x_n$ other than 0 based on a $K \times x_n$-bit or $K \times x_n+1$-bit code (hereinafter referred to as "code B"), which includes at least one bit value "x" and at least one bit value "y" in a first bit to a K-th bit included in the input code string, and in which the bit values of the $K \times (x_n-1)$ bits from the end are "y", wherein L partial codes, namely, (a) one partial code, which is constituted by K+1 bits from a first bit to a (K+1)-th bit of the code B when the code B is $K \times x_n+1$ bits, and in which the bit value of the first bit is "x" and the bit values of the second bit to the (K+1)-th bit are "y", (b) p−1 (i.e., $2^K-L-1$) partial codes, which are constituted by K bits from the first bit to the K-th bit of the code B when the code B is $K \times x_n$ bits, and in which the bit value of the first bit is "y" and the bit value of at least one bit among the K−1 bits from the second bit to the K-th bit is "x", and (c) 2q (i.e., $2L-2^K$) partial codes, which are constituted by K+1 bits from the first bit to the (K+1)-th bit of the code B when the code B is $K \times x_n+1$ bits, and in which the bit value of the first bit is "y", the bit value of at least one bit among the K−1 bits from the second bit to the K-th bit is "x", the set of K bits from the first bit to the K-th bit is different from the p−1 (i.e., $2^K-L-1$) partial codes of (b) above, and the bit value of the (K+1)-th bit is "x" or "y", are in one-to-one correspondence with the L numbers of the 0 to L−1 consecutive integer values 0 in the series of integer values obtained through the integer decoding step, where L is an integer that is 2 or more, K is the smallest natural number at which $2^K$ is greater than L, p is a natural number obtained by subtracting L from $2^K$, and q is a natural number obtained by subtracting $2^{K-1}$ from L, and the bit value "x" is a bit value "1" and the bit value "y" is a bit value "0", or the bit value "x" is the bit value "0" and the bit value "y" is the bit value "1".

* * * * *

UNITED STATES PATENT AND TRADEMARK OFFICE
CERTIFICATE OF CORRECTION

PATENT NO. : 11,438,009 B2
APPLICATION NO. : 17/289688
DATED : September 6, 2022
INVENTOR(S) : Ryosuke Sugiura, Takehiro Moriya and Yutaka Kamamoto It is certified that error appears in the above-identified patent and that said Letters Patent is hereby corrected as shown below:

In the Claims

Column 53, Line 50, In Claim 2, the formula reading - $p(x_n, 1-2^{-1/l})$ - should read -- $p(x_n, 1-2^{-1/L})$ --.

Column 54, Line 24, In Claim 5, the formula reading - $K \times x_n - 1)$ - should read -- $K \times (x_n - 1)$ --.

Column 55, Line 60, In Claim 10, "$2^1$ (is greater than L" should read -- $2^K$ is greater than L --.

Signed and Sealed this
Eighteenth Day of April, 2023

Katherine Kelly Vidal
*Director of the United States Patent and Trademark Office*